(12) United States Patent
Nakamura et al.

(10) Patent No.: US 12,178,143 B2
(45) Date of Patent: *Dec. 24, 2024

(54) SUPERCONDUCTING COMPLEX QUANTUM COMPUTING CIRCUIT

(71) Applicant: JAPAN SCIENCE AND TECHNOLOGY AGENCY, Kawaguchi (JP)

(72) Inventors: Yasunobu Nakamura, Tokyo (JP); Yutaka Tabuchi, Wako (JP); Shuhei Tamate, Tokyo (JP)

(73) Assignee: JAPAN SCIENCE AND TECHNOLOGY AGENCY, Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/224,685

(22) Filed: Jul. 21, 2023

(65) Prior Publication Data

US 2023/0380303 A1 Nov. 23, 2023

Related U.S. Application Data

(62) Division of application No. 17/283,037, filed as application No. PCT/IB2019/059335 on Oct. 31, 2019, now Pat. No. 11,758,829.

(51) Int. Cl.
*H10N 69/00* (2023.01)
*G06N 10/00* (2022.01)
(Continued)

(52) U.S. Cl.
CPC ............ *H10N 69/00* (2023.02); *G06N 10/00* (2019.01); *H10N 60/12* (2023.02); *H10N 60/805* (2023.02)

(58) Field of Classification Search
CPC ...... H10N 69/00; H10N 60/12; H10N 60/805; G06N 10/00; G06N 10/40
See application file for complete search history.

(56) References Cited

U.S. PATENT DOCUMENTS 7,613,764 B1 11/2009 Hilton et al.
7,613,765 B1 11/2009 Hilton et al.
(Continued)

FOREIGN PATENT DOCUMENTS

CN 107924490 A 4/2018
EP 3427310 B1 9/2021
(Continued)

OTHER PUBLICATIONS

Notice of Allowance issued by the Japan Patent Office for Application No. 2018-191287, Aug. 2, 2022, Japan.
(Continued)

*Primary Examiner* — Matthew L Reames
(74) *Attorney, Agent, or Firm* — Locke Lord LLP; Tim Tingkang Xia, Esq.

(57) ABSTRACT

A superconducting complex quantum computing circuit includes a circuit substrate in which a wiring pattern of a circuit element including quantum bits and measurement electrodes, and ground patterns are formed, and through-electrodes connecting the ground pattern formed on a first surface of the substrate surface and the ground pattern formed on a second surface; a first ground electrode including a first contact portion in contact with the ground patterns, and a first non-contact portion having a shape corresponding to a shape of the wiring pattern; a second ground electrode including a second contact portion in contact with the ground pattern; a control signal line provided with a contact spring pin at a tip; and a pressing member that presses the first ground electrode against the first surface of the circuit (Continued)

substrate or presses the second ground electrode against the second surface of the circuit substrate.

5 Claims, 21 Drawing Sheets

(51) Int. Cl.
  *H10N 60/12* (2023.01)
  *H10N 60/80* (2023.01)

(56) References Cited

U.S. PATENT DOCUMENTS

| | | | |
|---|---|---|---|
| 9,971,970 | B1 | 5/2018 | Rigetti et al. |
| 10,068,181 | B1 | 9/2018 | Rigetti et al. |
| 10,084,436 | B2 | 9/2018 | Goto |
| 2002/0117656 | A1 | 8/2002 | Amin et al. |
| 2014/0264287 | A1 | 9/2014 | Abraham et al. |
| 2015/0372217 | A1 | 12/2015 | Schoelkopf, III et al. |
| 2016/0292586 | A1 | 10/2016 | Rigetti et al. |
| 2016/0380636 | A1 | 12/2016 | Abdo |
| 2018/0019737 | A1 | 1/2018 | Goto |

FOREIGN PATENT DOCUMENTS

| | | | |
|---|---|---|---|
| JP | 2000114608 | A | 4/2000 |
| JP | 2001085810 | A | 3/2001 |
| JP | 2004039405 | A | 2/2004 |
| JP | 2007250771 | A | 9/2007 |
| JP | 2016511534 | A | 4/2016 |
| JP | 2018011266 | A | 1/2018 |
| WO | 2006011451 | A1 | 2/2006 |
| WO | 2014168665 | A2 | 10/2014 |
| WO | 2016199029 | A1 | 12/2016 |
| WO | 2017021714 | A1 | 2/2017 |
| WO | 2018052414 | A1 | 3/2018 |

OTHER PUBLICATIONS

Notice of Allowance issued by the Japan Patent Office for Application No. 2019-199420, Aug. 2, 2022, Japan.
Search Report issued by the European Patent Office for Application No. 19870463.7, Jul. 5, 2022, Europe.
Béjanin et al: "The Quantum Socket: Three-Dimensional Wiring for Extensible Quantum Computing", arxiv.org, Cornell University Library, 201 OLIN Library Cornell University Ithaca, NY 14853, Jun. 1, 2016 (Jun. 1, 2016), XP080705070.
Japan Patent Office, "International Search Report for PCT Application No. PCT/IB2019/059335", Japan, Jan. 28, 2020.
Notice Of Allowance issued by Taiwan Intellectual Property Office Ministry of Economic Affairs for Application No. 108139578, Taiwan, May 29, 2020.
European Search Report issued by the European Patent Office for Application 23185781.4, Mar. 12, 2024, Europe.
European Search Report issued by the European Patent Office for Application 23185781.4, Dec. 8, 2023, 1 Eueope.
Office Action issued by the State Intellectual Property Office of the Peoples Republic Of China for Application No. 201980062983.2, May 24, 2024, China.
Xunde Hua; Yue Gu, Electronic Technology, Issue No. 05 Design of High Temperature Superconductor Multiplexer.
Notice of Allowance issued by the Japan Patent Office for Application No. 2022-131712, Sep. 12, 2023, Japan.

SUPERCONDUCTING COMPLEX QUANTUM COMPUTING CIRCUIT

CROSS-REFERENCE TO RELATED PATENT APPLICATIONS

This application is a divisional application of U.S. patent application Ser. No. 17/283,037, filed on Apr. 6, 2021, now allowed, which is a U.S. national phase application of PCT Patent Application Serial No. PCT/IB2019/059335, filed on Oct. 31, 2019, which itself claims priority to Japanese Patent Application Serial No. 2018-191287, filed on Oct. 9, 2018, which are incorporated herein by reference in their entireties.

FIELD OF THE INVENTION

The present invention relates to a superconducting complex quantum computing circuit.

BACKGROUND OF THE INVENTION

Research and development for a technology related to a quantum computer are being performed. In the technology related to the quantum computer, a method for performing a two-quantum bit gate operation in the quantum computer using a superconducting quantum bit is known (see Patent Documents 1 and 2).

CITATION LIST

Patent Document 1: U.S. Pat. No. 7,613,765.
Patent Document 2: U.S. Patent Application Publication No. 2016/0380636.

SUMMARY OF THE INVENTION

Technical Problem

A quantum circuit according to the related art, which is developed for realization of a quantum computer using a superconducting circuit, has a circuit configuration in which it is difficult to completely turn off an unnecessary interaction between quantum bits required for operations. In a case where there is a residual interaction when the interaction is turned off, an error generated in the quantum bits propagates to surroundings and causes diffusion in addition to the residual interaction itself causing a control error of the quantum bits. The fact that the residual interaction itself causes the control error of the quantum bits and that the error generated in the quantum bits propagates and diffuses to the surroundings becomes a critical issue in implementation of the quantum computer having error tolerance, and at the same time, becomes a critical issue that leads to a decrease in computational accuracy and precision of approximated computation without having the error tolerance.

The present invention has been made in view of the above issues, and provides a superconducting complex quantum computing circuit which can suppress the interaction and the crosstalk among the quantum bits.

Solution to Problem

The present invention has been made to solve the above-mentioned problem, and according to one aspect of the present invention, there is provided a superconducting complex quantum computing circuit including: a circuit substrate in which a wiring pattern of a circuit element, which includes a quantum bit and a measurement electrode for observing a state of the quantum bit, and a ground pattern which is at a ground potential are formed on the substrate surface, and that includes a through-substrate electrode which connects the ground pattern formed on a first surface of the substrate surface and the ground pattern formed on a second surface, which is a surface opposite the first surface, inside the substrate; first ground electrodes that include a first contact portion which is in contact with the ground pattern formed on the first surface of the circuit substrate, and a first non-contact portion which has a shape corresponding to a shape of the wiring pattern formed on the first surface; a second ground electrode that includes a second contact portion which is in contact with the ground pattern formed on the second surface of the circuit substrate; a control signal line that is provided with a contact spring pin at a tip, the pin being in contact with a position corresponding to the quantum bit to press the first surface of the circuit substrate against the first ground electrode or to press the second surface of the circuit substrate against the second ground electrode; and a pressing member that presses the first ground electrode against the first surface of the circuit substrate or presses the second ground electrode against the second surface of the circuit substrate, in which the first ground electrode is in contact with the ground pattern via a first extension portion formed by a superconductor having extensibility higher than extensibility of the ground pattern, and the second ground electrode is in contact with the ground pattern via a second extension portion formed by a superconductor having extensibility higher than the extensibility of the ground pattern.

Further, according to one aspect of the present invention, the superconducting complex quantum computing circuit further includes the pressing member that presses the first ground electrode against the first surface of the circuit substrate or presses the second ground electrode against the second surface of the circuit substrate, in which the first ground electrode is in contact with the ground pattern via a first extension portion formed by a superconductor having extensibility higher than the extensibility of the ground pattern, and the second ground electrode is in contact with the ground pattern via a second extension portion formed by a superconductor having extensibility higher than the extensibility of the ground pattern.

Further, according to one aspect of the present invention, in the superconducting complex quantum computing circuit, the quantum bit includes a first electrode that has a first coupling capacitance with a ground portion, and a second electrode that has a second coupling capacitance with a ground portion larger than the first coupling capacitance and that is connected to the first electrode by a Josephson junction.

Further, according to one aspect of the present invention, in the superconducting complex quantum computing circuit, the circuit substrate includes, at a quantum bit correspondence position, which is a position of the second surface, corresponding to a position of the quantum bit included in the wiring pattern formed on the first surface, a central electrode, a surrounding electrode that surrounds the surroundings of the central electrode, and a connection electrode that connects the central electrode and the surrounding electrode.

Further, according to one aspect of the present invention, in the superconducting complex quantum computing circuit, a control signal line is further included that supplies a control signal to the quantum bit and that is arranged inside the first non-contact portion included in the first ground electrode at a position corresponding to a position of the quantum bit included in the wiring pattern formed on the first surface or inside a second non-contact portion included in the second ground electrode at a position corresponding to a quantum bit correspondence position, which is a position of the second surface corresponding to the position of the quantum bit included in the wiring pattern formed on the first surface.

Further, according to one aspect of the present invention, in the superconducting complex quantum computing circuit, the first non-contact portion and the second non-contact portion have a width and a height with sizes smaller than a wavelength of the control signal. Further, according to one aspect of the present invention, in the above-mentioned superconducting complex quantum computing circuit, a frequency band of the control signal is a microwave band.

Advantageous Effects of the Invention

According to the present invention, it is possible to suppress interaction and crosstalk between quantum bits.

DESCRIPTION OF EMBODIMENTS OF THE INVENTION

Figure 1:
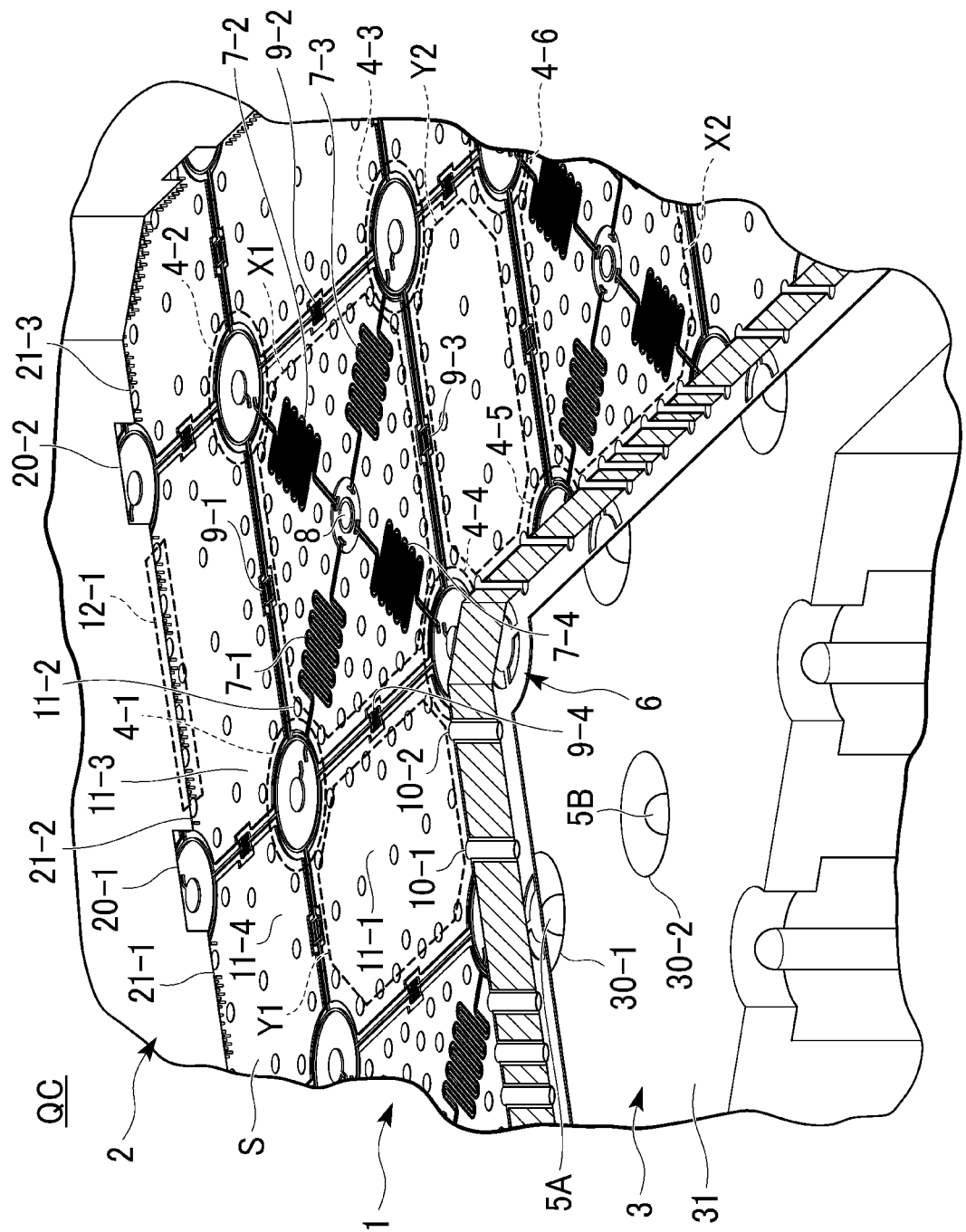
FIG. 1 is a diagram showing an example of a configuration of a superconducting complex quantum computing circuit according to an embodiment of the present invention.

Hereinafter, embodiments of the present invention will be described in detail with reference to the accompanying drawings. FIG. 1 is a diagram showing an example of a configuration of a superconducting complex quantum computing circuit QC according to the present embodiment. The superconducting complex quantum computing circuit QC includes a circuit substrate 1, a first ground electrode 2, and a second ground electrode 3. The circuit substrate 1 is sandwiched between the first ground electrode 2 and the second ground electrode 3.

A side where the first ground electrode 2 is provided is referred to as an upper side when viewed from the circuit substrate 1, and a side where the second ground electrode 3 is provided is referred to as a lower side when viewed from the circuit substrate 1.

The circuit substrate 1 is, for example, a dielectric substrate such as silicon. In the circuit substrate 1, a wiring pattern CP of a circuit element and a ground pattern GP are formed by a superconducting film on a substrate surface S of the dielectric substrate such as silicon. In a case where a material of the circuit substrate 1 is silicon, the circuit substrate 1 is provided at a temperature lower than a predetermined temperature, and the silicon is a dielectric.

The wiring pattern CP includes a quantum bit 4, an observation electrode 8 for observing a state of the quantum bit 4, a superconducting resonator 7, and a capacitor 9. In FIG. 1, as an example of the quantum bit 4, quantum bits 4-1 to 4-6 are shown. In FIG. 1, as an example of the superconducting resonator 7, superconducting resonators 7-1 to 7-4 are shown. In FIG. 1, as an example of the capacitor 9, capacitors 9-1 to 9-4 are shown.

The ground pattern GP is at a ground potential. The ground pattern GP includes a first ground pattern GP1 and a second ground pattern GP2. The first ground pattern GP1 is formed on a first surface S1 on the upper side of the substrate surface S. A second ground pattern GP2 is formed on a second surface S2 which is a surface opposite the first surface S1. The first ground pattern GP1 includes a substrate top surface ground electrode 11. In FIG. 1, as an example of the substrate top surface ground electrode 11, substrate top surface ground electrodes 11-1 to 11-4 are shown.

A through-electrode 10 connects the first ground pattern GP1 formed on the first surface S1 of the circuit substrate 1 to the second ground pattern GP2 formed on the second surface S2, which is the surface opposite the first surface S1, inside the substrate. The first ground pattern GP1 is in electrical contact with the second ground pattern GP2 through the through-electrode 10. In FIG. 1, as an example of the through-electrode 10, a through-electrode 10-1 and a through-electrode 10-2 are shown.

Further, a quadrangular area having four adjacent quantum bits 4, such as quantum bits 4-1 to 4-4, as vertices on the substrate surface S of the circuit substrate 1 is referred to as an observation area X. In FIG. 1, as an example of the observation area X, an observation area X1 and an observation area X2 are shown.

A quadrangular area having four adjacent quantum bits 4, such as the quantum bit 4-4, the quantum bit 4-3, a quantum bit 4-5, and a quantum bit 4-6, which are adjacent to each other, as vertices on the dielectric substrate of the circuit substrate 1 is referred to as a gap ground area Y. In FIG. 1, as an example of the gap ground area Y, a first gap ground area Y1 and a first gap ground area Y2 are shown.

On the substrate surface S, a pattern having the observation area X and the gap ground area Y surrounding the observation area X is repeated. In FIG. 1, a part of the pattern is shown.

As described above, in the circuit substrate 1, the wiring pattern CP of the circuit element, which includes the quantum bit 4 and the observation electrode 8 for observing the state of the quantum bit 4, and the ground pattern GP, which is at the ground potential, are formed on the substrate surface S. The circuit substrate 1 includes the through-electrode 10 which connects the first ground pattern GP1 formed on the first surface S1 of the substrate surface S and the second ground pattern GP2 formed on the second surface S2, which is the surface opposite the first surface S1, inside the substrate.

The superconducting film is formed on the first ground electrode 2 after an etching process is performed on a surface facing the substrate surface S in accordance with the wiring pattern CP on the substrate surface S. A first non-contact portion 20 is formed in the first ground electrode 2 by the etching process.

The first non-contact portion 20 is not in contact with the first surface S1 of the substrate surface S. A distance between the first non-contact portion 20 and the first surface S1 is, for example, several tens to several hundreds of microns in a case where a control signal frequency is about 10 GHz. A width and a height of the first non-contact portion 20 (the same as a second non-contact portion 30) have sizes smaller than a wavelength of the control signal. The first non-contact portion 20 has a shape corresponding to a shape of the wiring pattern CP formed on the first surface S1 of the substrate surface S.

On the other hand, the first ground electrode 2 is provided with a first contact portion 21 as a part of the surface of the first ground electrode 2 facing the substrate surface S other than the first non-contact portion 20.

The first contact portion 21 is in contact with the first ground pattern GP1 formed on the first surface S1 of the circuit substrate 1 via a top surface superconducting micro bump 12-1. The top surface superconducting micro bump 12-1 is, for example, a superconductor having extensibility higher than extensibility of the ground pattern GP. The top surface superconducting micro bump 12-1 is an example of a first extension portion 12.

Here, in the present embodiment, the extensibility is a property of malleability or ductility, or both malleability and ductility. In FIG. 1, as an example of the first contact portion 21, a first contact portion 21-1, a first contact portion 21-2, and a first contact portion 21-3 are shown.

As described above, the first ground electrode 2 is in contact with the ground pattern GP via the first extension portion 12 formed by the superconductor having the extensibility higher than the extensibility of the ground pattern GP.

Here, the first non-contact portion 20 and the first contact portion 21 will be described with reference to FIGS. 2 and 3.

Figure 2:
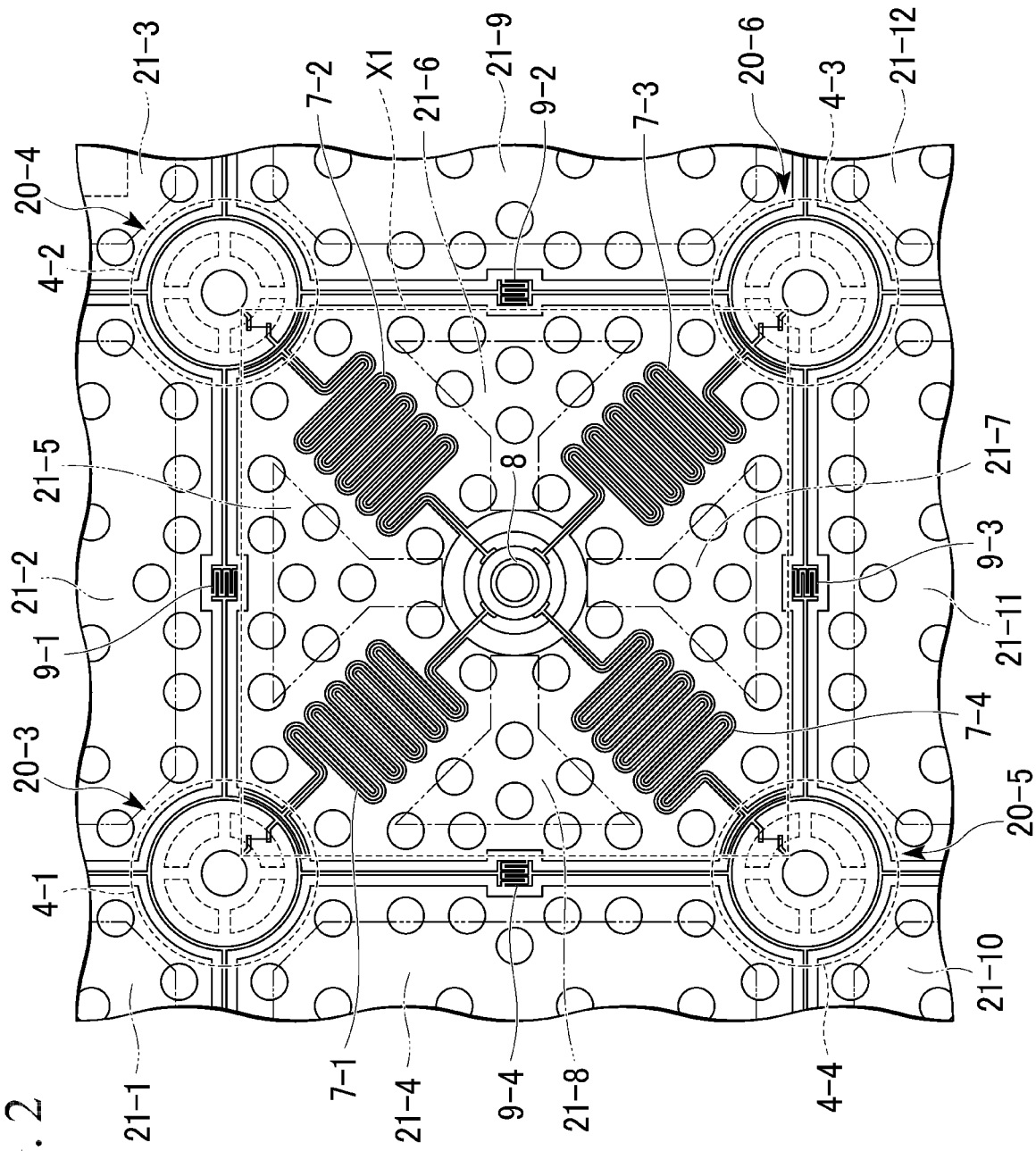
FIG. 2 is a top view of an observation area of a substrate surface according to the embodiment of the present invention.

FIG. 2 is a top view of the observation area X1 of the substrate surface S according to the present embodiment.

In FIG. 2, as an example of the first non-contact portion 20, a first non-contact portion 20-3, a first non-contact portion 20-4, a first non-contact portion 20-5, and a first non-contact portion 20-6 are shown.

Figure 3:
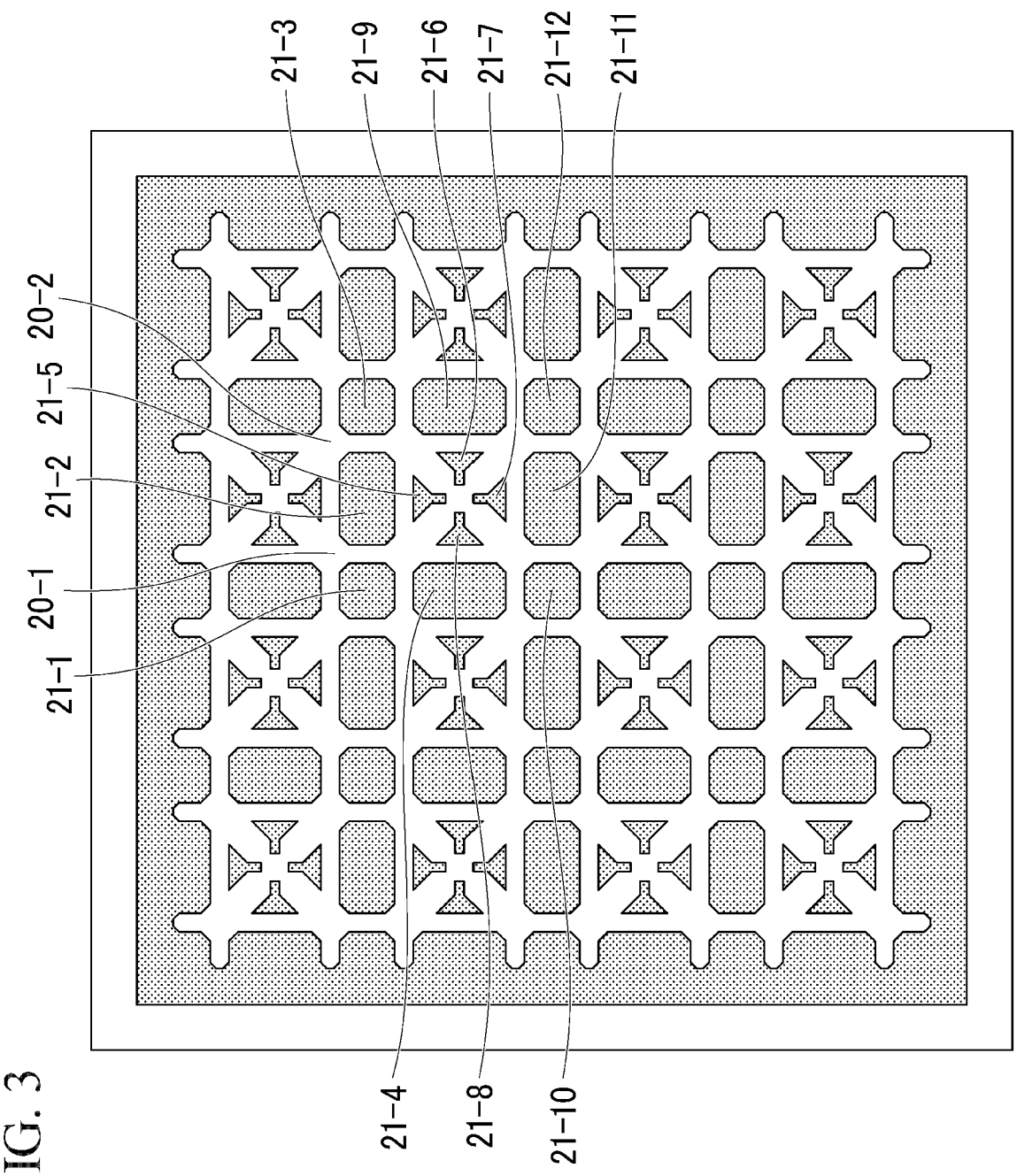
FIG. 3 is a diagram showing an example of a first non-contact portion and a first contact portion according to the embodiment of the present invention.

FIG. 3 is a diagram showing an example of the first non-contact portion 20 and the first contact portion 21 according to the present embodiment. In FIG. 3, as an example of the first contact portion 21, first contact portions 21-1 to 21-12 are shown. The first non-contact portion 20 is a portion excluding the first contact portion 21, and is formed by performing the etching process as described above. In FIG. 3, as an example of the first non-contact portion 20, a first non-contact portion 20-1 and a first non-contact portion 20-2 are shown.

As described above, the first ground electrode 2 includes the first contact portion 21 which is in contact with the first ground pattern GP1 formed on the first surface S1 of the circuit substrate 1, and the first non-contact portion 20 which has a shape corresponding to the shape of the wiring pattern CP formed on the first surface S1.

Returning to FIG. 1, description of the superconducting complex quantum computing circuit QC is continued.

The quantum bit 4 is a superconducting quantum bit formed on a superconducting thin film. Here, the quantum bit 4 will be described with reference to FIGS. 4 and 5.

Figure 4:
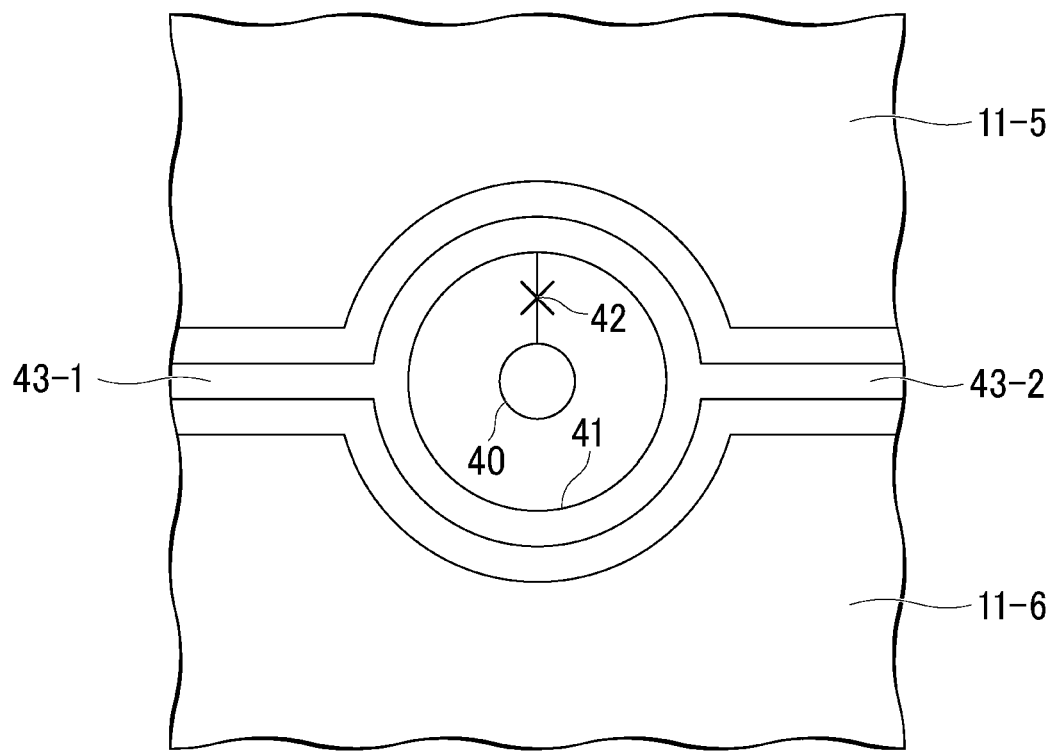
FIG. 4 is a diagram showing an example of a quantum bit according to the embodiment of the present invention.

FIG. 4 is a diagram showing an example of the quantum bit 4 according to the present embodiment. The quantum bit 4 includes an inner disk 40, an outer ring 41, a Josephson junction 42, a quantum bit hand portion 43-1, and a quantum bit hand portion 43-2. Each of the inner disk 40, the outer ring 41, the quantum bit hand portion 43-1 and the quantum bit hand portion 43-2 is a metal electrode.

The inner disk 40 and the outer ring 41 form concentric metal electrodes. The inner disk 40 and the outer ring 41 are joined by the Josephson junction 42. The outer ring 41 is connected to the quantum bit hand portion 43-1, the quantum bit hand portion 43-2, a quantum bit hand portion 43-3, and a quantum bit hand portion 43-4. In FIG. 4, the quantum bit hand portion 43-3 and the quantum bit hand portion 43-4 are not shown.

The surroundings of the outer ring 41 are surrounded by the substrate top surface ground electrode 11. The substrate top surface ground electrode 11-1 and the substrate top surface ground electrode 11-2 are examples of the substrate top surface ground electrode 11.

Here, a first equivalent circuit 4C, which is an equivalent circuit of the quantum bit 4, will be described with reference to FIG. 5.

Figure 5:
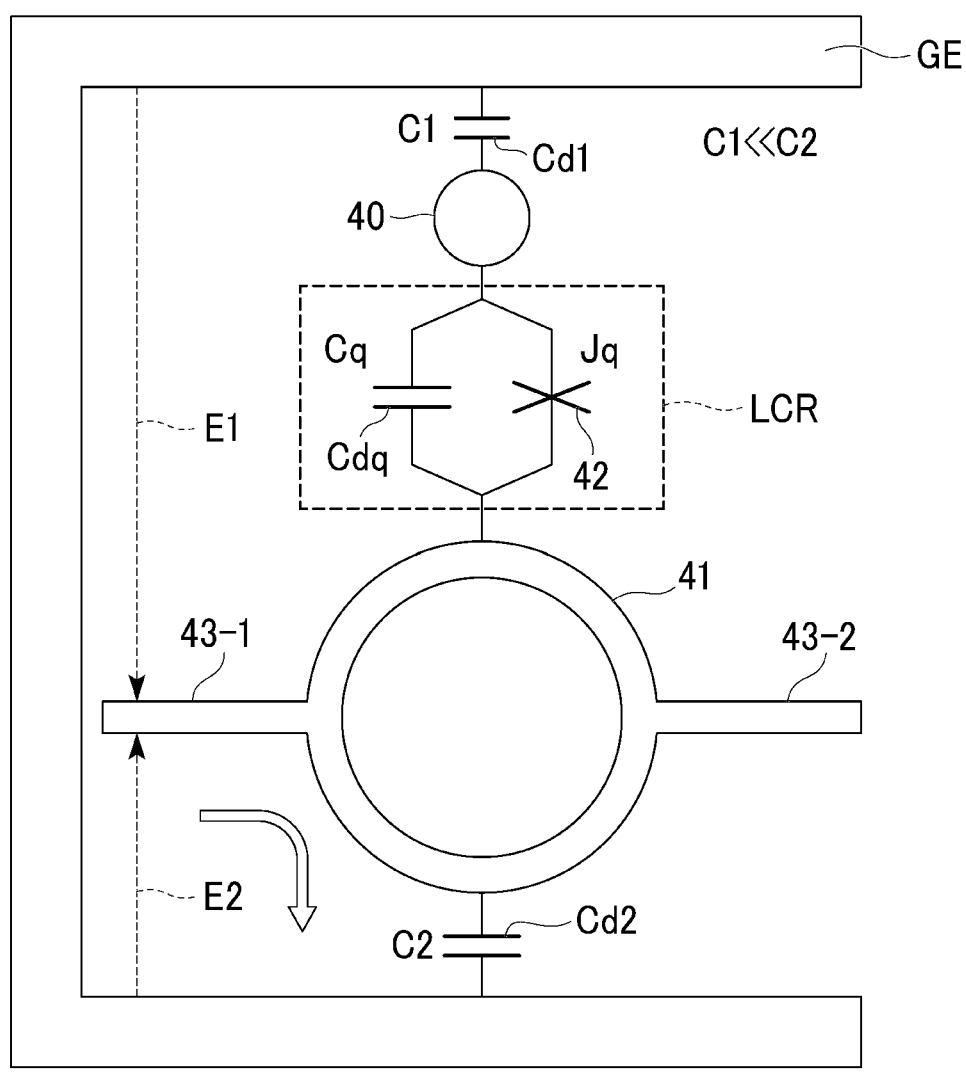
FIG. 5 is a diagram showing an example of a first equivalent circuit according to the embodiment of the present invention.

FIG. 5 is a diagram showing an example of the first equivalent circuit 4C according to the present embodiment. A capacitor $C_{dq}$ is formed between the inner disk 40 and the outer ring 41 which are the concentric metal electrodes. In the first equivalent circuit 4C, a non-linear LC resonator LCR is formed by the capacitor Cdq and an inductor derived from the Josephson junction 42. The capacitor Cdq has a capacitance Cq.

The first ground electrode 2, the second ground electrode 3, the substrate top surface ground electrode 11, and a substrate bottom surface ground electrode 13 are collectively referred to as a ground portion GE.

A first capacitor Cd1 is formed between the inner disk 40 and the ground portion GE. The first capacitor Cd1 has a first capacitance C1. The first capacitance C1 is mainly determined by a distance between the inner disk 40 and the substrate top surface ground electrode 11. In the example of FIG. 4, the distance between the inner disk 40 and the substrate top surface ground electrode 11 is determined by a radius of the inner disk 40.

A second capacitor Cd2 is formed between the outer ring 41 and the ground portion GE. The second capacitor Cd2 has a second capacitance C2. The second capacitance is mainly determined by a distance between the outer ring 41 and the substrate top surface ground electrode 11. The distance between the outer ring 41 and the substrate top surface ground electrode 11 is determined by a radius of the outer ring 41.

An unnecessary radiation electric field E may be generated between the quantum bit 4 and the first ground electrode 2 or between the quantum bit 4 and the ground portion GE. An unnecessary radiation electric field El is an example of the unnecessary radiation electric field E between the quantum bit 4 and the ground portion GE. An unnecessary radiation electric field E2 is an example of the unnecessary radiation electric field E between the quantum bit 4 and the ground portion GE.

In the quantum bit 4, the radius of the inner disk 40 and the radius of the outer ring 41 are determined based on a condition that the second capacitance C2 is larger than the first capacitance C1. In the quantum bit 4, the radius of the outer ring 41 is increased so that the second capacitance C2 is larger than the first capacitance C1.

In the quantum bit 4, since the second capacitance C2 is larger than the first capacitance C1, fluctuation of a potential due to the unnecessary radiation electric field E is propagated to the ground portion GE via the outer ring 41. That is, the second capacitor Cd2 functions as a so-called bypass condenser.

Since the fluctuation of the potential due to the unnecessary radiation electric field E is propagated to the ground portion GE via the outer ring 41, a potential difference between the inner disk 40 and the outer ring 41 is hardly affected by the fluctuation of the potential due to the unnecessary radiation electric field E, compared to a case where the second capacitance C2 is not larger than the first capacitance C1. Here, it is necessary that the potential difference between the inner disk 40 and the outer ring 41 be stable with respect to the unnecessary radiation electric field E so that the quantum bit 4 functions as an element for recording bit information.

As described above, the quantum bit 4 includes the inner disk 40 which has the first capacitance C1 with the ground portion GE, and the outer ring 41 which has the second capacitance C2 with the ground portion GE larger than the first capacitance C1, and which is connected to the inner disk 40 by the Josephson junction 42.

Returning to FIG. 1, description of the configuration of the superconducting complex quantum computing circuit QC is continued.

The second ground electrode 3 is an aluminum electrode, as an example. The second ground electrode 3 includes the second non-contact portion 30 and a second contact portion 31.

The second non-contact portion 30 is not in contact with the second surface S2 which is a surface on a lower side of the substrate surface S of the circuit substrate 1. The second ground electrode 3 includes the second non-contact portion 30 at a position corresponding to a quantum bit correspondence position. Here, a quantum bit correspondence position is a position of the second surface S2 corresponding to the position of the quantum bit 4 included in the wiring pattern CP formed on the first surface 51 which is a surface on an upper side of the substrate surface S of the circuit substrate 1. In FIG. 1, as an example of the second non-contact portion 30, a second non-contact portion 30-1 and a second non-contact portion 30-2 are shown.

The second contact portion 31 is in contact with the second ground pattern GP2 formed on the second surface S2 via a second extension portion 14. Here, the second extension portion 14 is a superconductor such as indium having extensibility higher than the extensibility of the ground pattern GP. The second extension portion 14 includes a conductive contact portion 14-1 and a conductive contact portion 14-2, which will be described later.

That is, the second ground electrode 3 is in contact with the ground pattern GP via the second extension portion 14 formed by the superconductor having extensibility higher than the extensibility of the ground pattern GP.

In the second non-contact portion 30, a control signal line 5 is arranged to extend in a direction perpendicular to the second surface S2 from the lower side. The control signal line 5 has two types including a control signal line 5A and an observation signal line 5B. The control signal line 5A is the control signal line 5 for transmitting a control signal to the quantum bit 4.

The observation signal line 5B is the control signal line 5 for fetching an observation result of the state of the quantum bit 4 as a signal (referred to as an observation signal). The observation signal is generated by reflecting the observation result of the state of the quantum bit 4 by transmitting a probe signal through the observation signal line 5B and reflecting the probe signal on the second surface S2 of the observation electrode 8.

Microwaves in a 4 to 12 gigahertz band are usually used as the control signal and the observation signal, as an example. That is, in the superconducting complex quantum computing circuit QC, a frequency band of the control signal is the microwave band.

A control current, which is the control signal of the quantum bit, is propagated to the control signal line 5A and flows into a filter pattern 6 formed on the substrate bottom surface ground electrode 13 by a contact spring pin 50A which is provided at a tip of the control signal line 5A. The control current flowing into the filter pattern 6 formed on the second surface S2, which is a surface on a lower side of the circuit substrate 1, is circulated to the substrate bottom surface ground electrode 13 after passing through several thin wires from the filter pattern 6 formed on the second surface S2.

As described above, the second ground electrode 3 includes the second contact portion 31 which is in contact with the second ground pattern GP2 formed on the second surface S2 of the circuit substrate 1.

Further, the control signal line 5 is arranged inside the second non-contact portion 30 included in the second ground electrode 3 at a position corresponding to the quantum bit correspondence position, which is the position of the second surface S2 corresponding to the position of the quantum bit 4 included in the wiring pattern CP formed on the first surface S1, and supplies the control signal to the quantum bit 4. The control signal line 5 is arranged in a direction perpendicular to the substrate surface S of the circuit substrate 1 on which the quantum bit 4 is arranged. That is, the control signal line 5 is arranged based on a three-dimensional structure.

Here, the filter pattern 6 will be described with reference to FIGS. 6 and 7.

Figure 6:
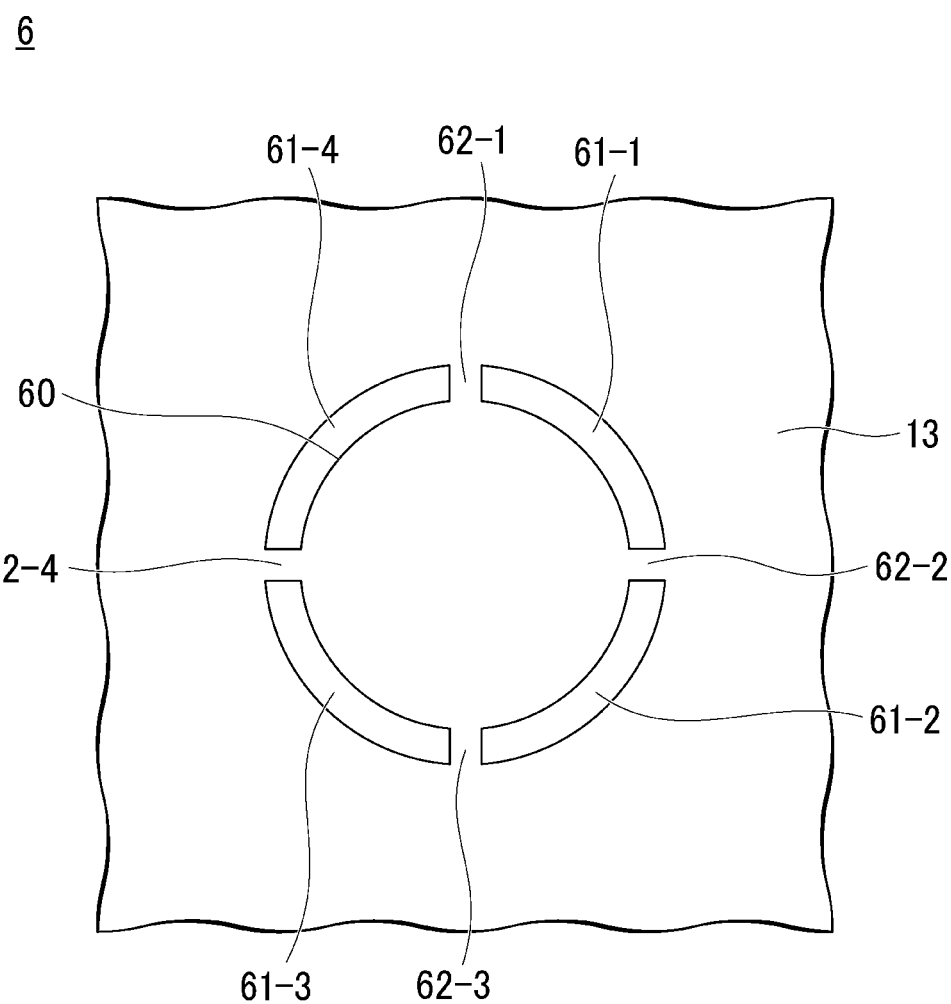
FIG. 6 is a diagram showing an example of a filter pattern according to the embodiment of the present invention.

FIG. 6 is a diagram showing an example of the filter pattern 6 according to the present embodiment. The filter pattern 6 is provided at the quantum bit correspondence position which is the position of the second surface S2 corresponding to the position of the quantum bit 4.

The filter pattern 6 includes a central electrode 60 and a connection electrode 62. The central electrode 60 is a circular electrode. The central electrode 60 is surrounded by the substrate bottom surface ground electrode 13 via a gap portion 61. The central electrode 60 and the substrate bottom surface ground electrode 13 are connected via the connection electrode 62.

Here, the connection electrode 62 is a thin wire-shaped metal electrode having a width of several tens of micrometers.

In FIG. 6, gap portions 61-1 to 61-4 are examples of the gap portion 61. In FIG. 6, connection electrodes 62-1 to 62-4 are examples of the connection electrode 62.

Here, a second equivalent circuit 4Ca, which is an equivalent circuit of the quantum bit 4 in a case where the filter pattern 6 is included, will be described with reference to FIG. 7.

Figure 7:
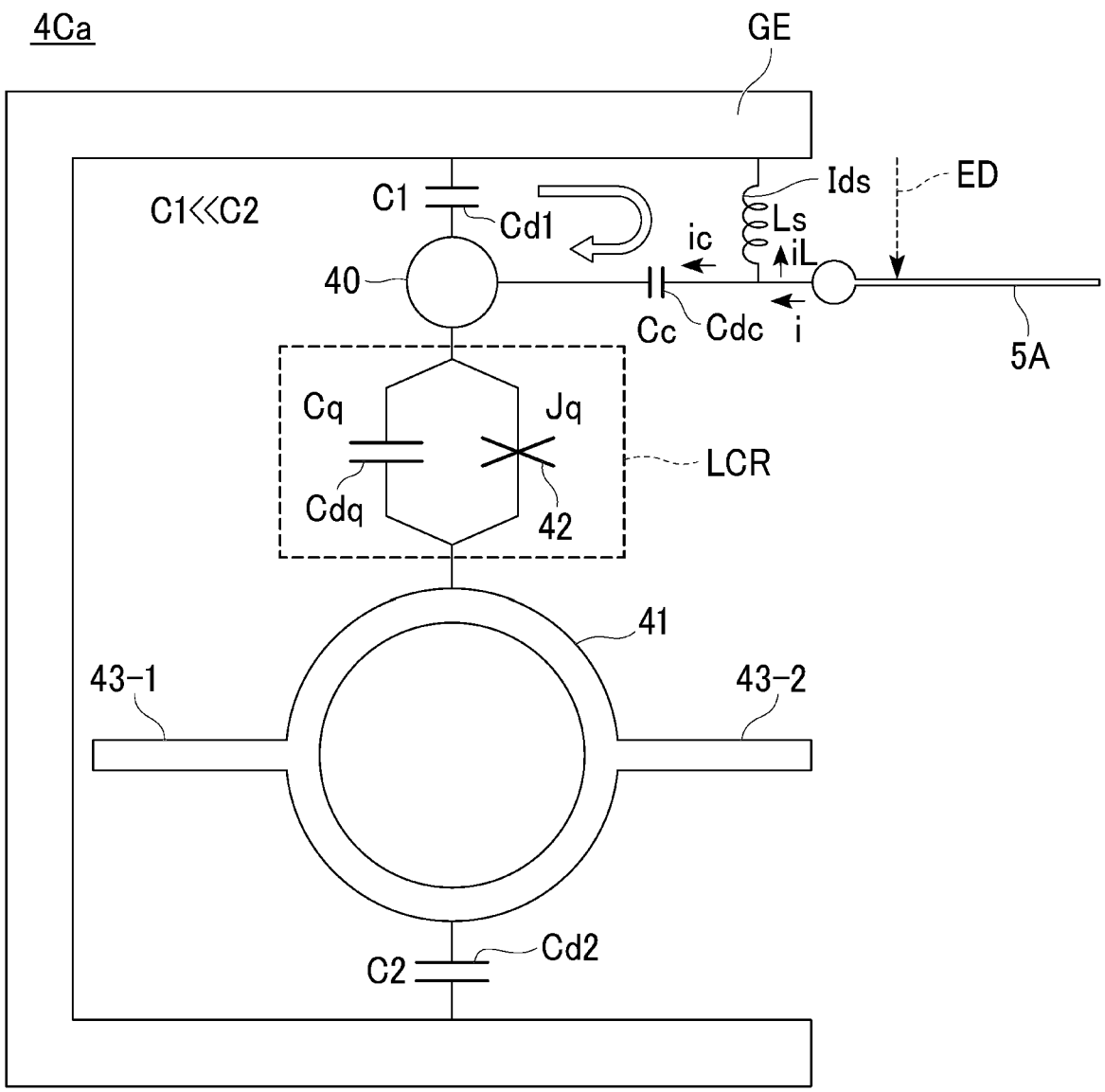
FIG. 7 is a diagram showing an example of a second equivalent circuit according to the embodiment of the present invention.

FIG. 7 is a diagram showing an example of the second equivalent circuit 4Ca according to the present embodiment. In a case where the second equivalent circuit 4Ca (FIG. 7) is compared with the first equivalent circuit 4C (FIG. 5), the control signal line 5A, an inductor Ids, and a third capacitor Cdc are different, and functions of other components (the first capacitor Cd1, the second capacitor Cd2, the LC resonator LCR, the inner disk 40, the outer ring 41, the quantum bit hand portion 43-1, the quantum bit hand portion 43-2, and the ground portion GE) are the same. In FIG. 7, parts which are different from the first equivalent circuit 4C in FIG. 5 will be mainly described.

The third capacitor Cdc is formed between the control signal line 5A and the inner disk 40. The third capacitor Cdc has a third capacitance Cc.

The connection electrode 62 forms the inductor Ids provided in parallel with the third capacitor Cdc. The inductor Ids connects the control signal line 5A and the ground portion GE. The inductor Ids has an inductance Ls.

A drive electric field ED is an electric field generated by the control current flowing through the control signal line 5A.

The inductor Ids, the third capacitance Cc, the first capacitor Cd1, and the second capacitor Cd2 form a high-pass filter. Here, since the second capacitance C2 of the second capacitor Cd2 is sufficiently larger than the first capacitance C1 of the first capacitor Cd1, the second capacitor Cd2 almost has an effect, compared to an effect of the first capacitor Cd1, on the first capacitor Cd1 and the second capacitor Cd2 of the high-pass filter. The high-pass filter passes a signal at a frequency sufficiently higher than the microwave band to the outside of the control signal line 5A or the like. As described above, the microwaves are used as the control signal of the quantum bit 4. The inductor Ids suppresses energy of the quantum bit 4 from leaking to the outside.

Here, an effect of the connection electrode 62, which is the inductor Ids, will be described.

The control current supplied from the control signal line 5A is defined as a control current I, a current component of the control current I flowing to a side of the third capacitor Cdc is defined as a current Ic, and a current component of the control current I flowing to a side of the inductor Ids is defined as a current IL. A magnitude of the control current I is defined as a magnitude i, a magnitude of the current Ic is defined as a magnitude iC, and a magnitude of the current IL is defined as a magnitude iL.

In a case where the inductance Ls of the inductor Ids is infinite, the magnitude iL of the current IL becomes zero, and the magnitude iC of the current Ic becomes equal to the magnitude i of the control current I. In a case where the LC resonator LCR resonates, a magnitude of a parallel impedance becomes zero.

The current flowing through the LC resonator LCR is the current component that flows to a side of the second capacitor Cd2 of the current component of the current Ic that flows to a side of the first capacitor Cd1 and the current component that flows to the side of the second capacitor Cd2. A magnitude of the current flowing through the LC resonator LCR is represented as in Equation (1).

$$\frac{\frac{1}{C_1}}{\frac{1}{C_1}+\frac{1}{C_2}}i_c = \frac{C_2}{C_1+C_2}i_c \qquad (1)$$

In a case where the inductance Ls becomes small, the magnitude iL of the current IL increases and the magnitude iC of the current Ic decreases. Therefore, according to the above Equation (1), in a case where the inductance Ls becomes small, the magnitude of the current flowing through the LC resonator LCR decreases.

Here, the magnitude i of the control current I is represented as in Equation (2).

$$i = \frac{\left(\frac{1}{j\omega(C_1+C_2)}+\frac{1}{j\omega C_c}\right)j\omega L_S}{\frac{1}{j\omega(C_1+C_2)}+\frac{1}{j\omega C_c}+j\omega L_S}V \qquad (2)$$

In a case where the second capacitance C2 is sufficiently larger than the third capacitance Cc, the magnitude i of the control current I is represented as in Equation (3) based on Equation (2).

$$i \xrightarrow{C_2 \gg C_c} \frac{\frac{L_S}{C_c}}{\frac{1}{j\omega C_c}+j\omega L_S}V \qquad (3)$$

In a case where the second capacitance C2 is sufficiently larger than the third capacitance Cc, the magnitude iC of the current Ic is represented as in Equation (4) based on Equation (3).

$$i_C \xrightarrow{C_2 \gg C_c} \frac{j\omega L_S}{\frac{1}{j\omega C_c} + j\omega L_S} \cdot i = \frac{j\omega \frac{L_S^2}{C_c}}{\left(\frac{1}{j\omega C_c} + j\omega L_S\right)^2} \cdot V = \quad (4)$$

$$\frac{\frac{1}{j\omega C_c} \cdot V}{\left(1 - (\omega^2 L C_c)^{-1}\right)^2}$$

Here, a relationship between the control current I of the current Ic flowing through the third capacitor Cdc with respect to a frequency ω will be described with reference to FIG. 8.

Figure 8:
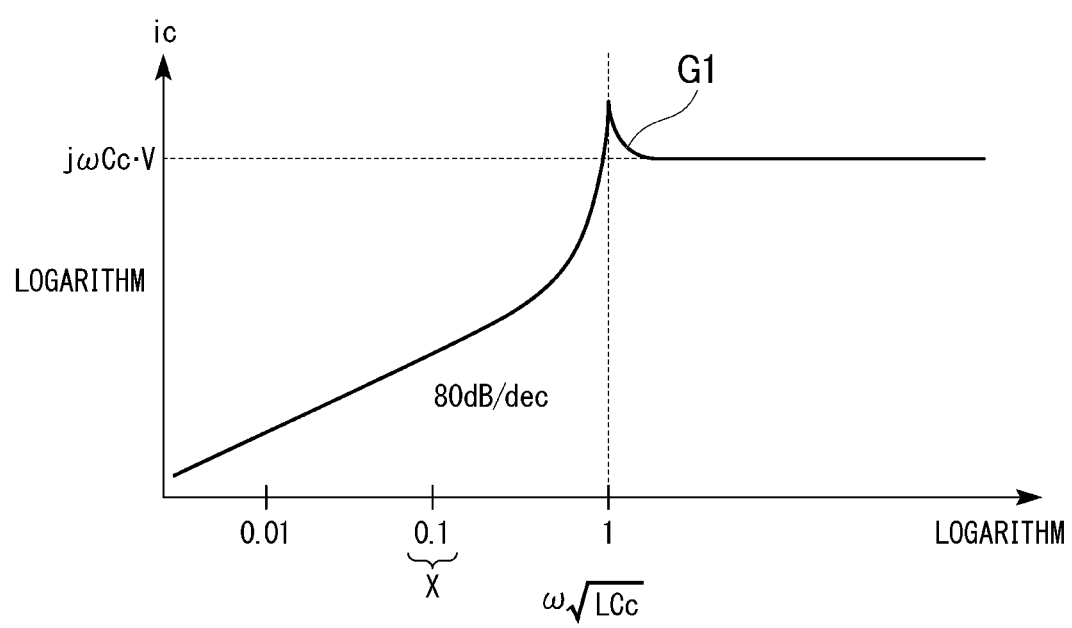
FIG. 8 is a diagram showing an example of a relationship of a current flowing through a third capacitor according to the embodiment of the present invention with respect to a frequency of a control current.

FIG. 8 is a diagram showing an example of the relationship between the control current I of the current Ic flowing through the third capacitor Cdc with respect to the frequency ω according to the present embodiment. A graph G1 shows a logarithm of the magnitude iC of the current Ic with respect to a logarithm of the frequency ω of the control current I. Here, on a horizontal axis of the graph G1, the frequency ω of the control current I is standardized by a resonance frequency of the LC resonator of the inductor Ids and the third capacitor Cdc.

Here, the resonance frequency of the LC resonator LCR is represented in Equation (5).

$$\frac{1}{2\pi} \frac{1}{\sqrt{(C_q + C_1)L_S}} \quad (5)$$

The resonance frequency, which is in the microwave band, of the LC resonator LCR corresponds to a value included in a range X in the vicinity of a value of 0.1 on the coordinate of the horizontal axis. Since the frequency ω of the control current I is in the microwave band, the inductor Ids does not pass frequencies lower than the range X, and functions as the high-pass filter.

As described above, the circuit substrate 1 includes, at the quantum bit correspondence position, which is the position of the second surface S2 corresponding to the position of the quantum bit 4 included in the first ground pattern GP1 formed on the first surface 51, the central electrode 60, the substrate bottom surface ground electrode 13 which surrounds the surroundings of the central electrode 60, and the connection electrode 62 which connects the central electrode 60 and the substrate bottom surface ground electrode 13.

Here, a cross section of a part of the quantum bit 4 of the superconducting complex quantum computing circuit QC will be described with reference to FIG. 9.

Figure 9:
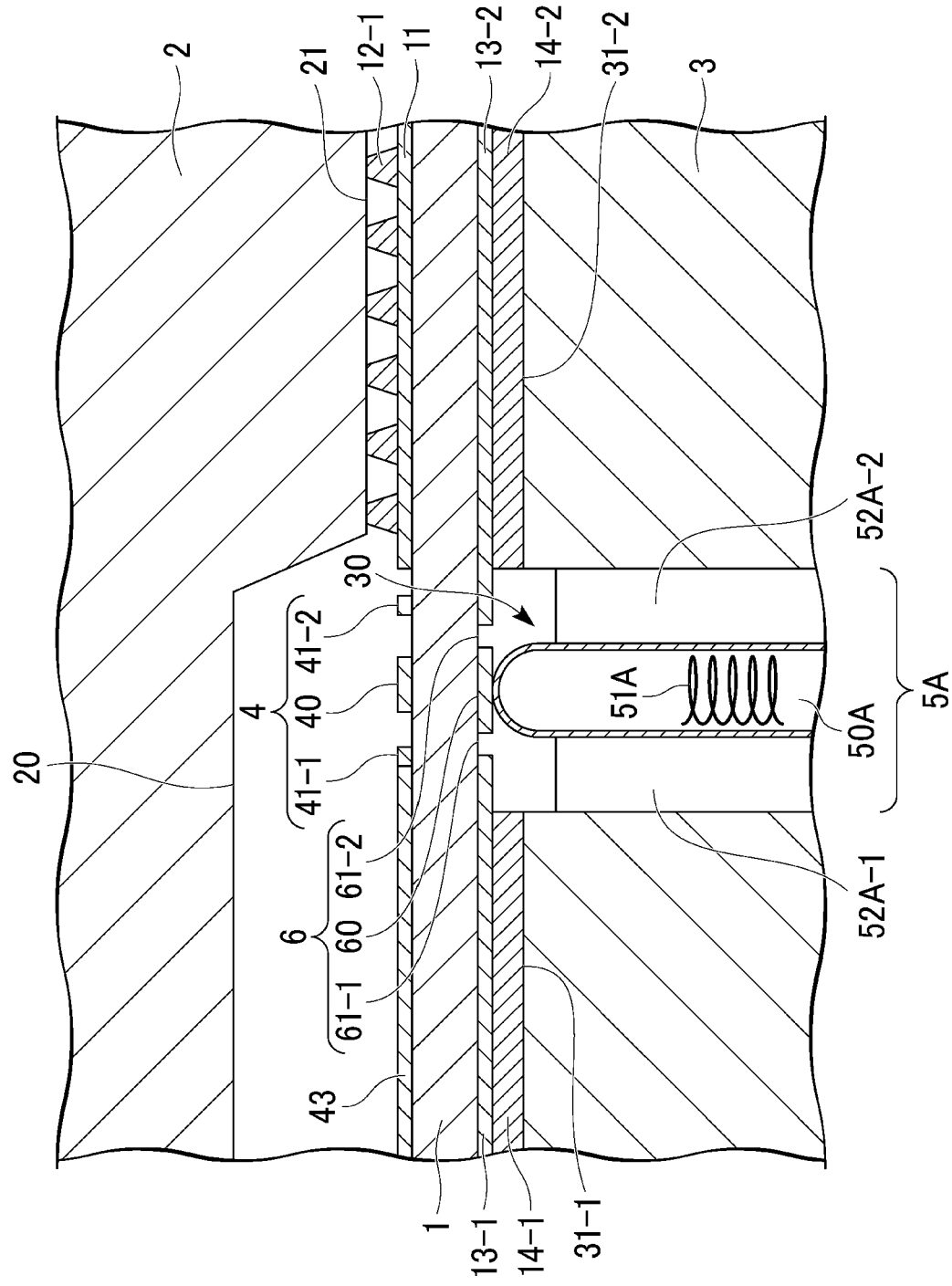
FIG. 9 is a diagram showing an example of a cross section of a part of the quantum bit of the superconducting complex quantum computing circuit according to the embodiment of the present invention.

FIG. 9 is a diagram showing an example of the cross section of the part of the quantum bit 4 of the superconducting complex quantum computing circuit QC according to the present embodiment.

The control signal line 5A includes the contact spring pin 50A and a coaxial wire dielectric portion 52A. The contact spring pin 50A includes a spring 51A inside, and presses the circuit substrate 1 against the first ground electrode 2 by elastic force of the spring 51A. The coaxial wire dielectric portion 52A insulates the contact spring pin 50A from the second ground electrode 3. A shape of the coaxial wire dielectric portion 52A is a cylindrical shape. FIG. 9 shows, as an example of a cross section of the coaxial wire dielectric portion 52A, a coaxial wire dielectric portion 52A-1 and a coaxial wire dielectric portion 52A-2.

The conductive contact portion 14-1 is provided between the substrate bottom surface ground electrode 13-1 and a second contact portion 31-1. The conductive contact portion 14-2 is provided between a substrate bottom surface ground electrode 13-2 and a second contact portion 31-2. As described above, the conductive contact portion 14-1 and the conductive contact portion 14-2 are examples of the second extension portion 14.

The superconducting micro bump may be provided instead of the conductive contact portion 14-1 and the conductive contact portion 14-2.

Here, the superconducting complex quantum computing circuit QC includes a pressing member P (not shown), which presses the first ground electrode 2 against the first surface S1 of the circuit substrate 1, on an upper side of the first ground electrode 2. Here, the pressing member P presses the first ground electrode 2 against the first surface S1 of the circuit substrate 1 in a direction opposite to the elastic force of the spring 51A.

The pressing member P presses the first ground electrode 2 against the first surface S1 of the circuit substrate 1, thereby causing the first ground electrode 2 to be adhered to the circuit substrate 1 and causing the circuit substrate 1 to be adhered to the second ground electrode 3. The pressing member P is a leaf spring or a contact spring pin, as an example.

With this configuration, the substrate bottom surface ground electrode 13-1 and the substrate bottom surface ground electrode 13-2 are adhered to the second ground electrode 3, and the potentials thereof are equalized with the potential of the ground portion GE. As a result, since the potential of the outer ring 41 is effectively the same as that of the ground portion GE via the second capacitance C2, it is possible to cause the control signal to the quantum bit to reach the inner disk 40 and the Josephson junction 42 that form the quantum bit with almost no leakage or crosstalk.

Returning to FIG. 1, description of the superconducting complex quantum computing circuit QC is continued.

The superconducting resonator 7 reads out the state of the quantum bit 4 by interacting with the quantum bit 4. The four adjacent superconducting resonators 7-1 to 7-4 are aggregated by the observation electrode 8. As described above, the read state of the quantum bit 4 is fetched as the observation signal to the observation signal line 5B via the observation electrode 8.

Here, the superconducting resonator 7 and the observation electrode 8 will be described with reference to FIGS. 10 and 11.

Figure 10:
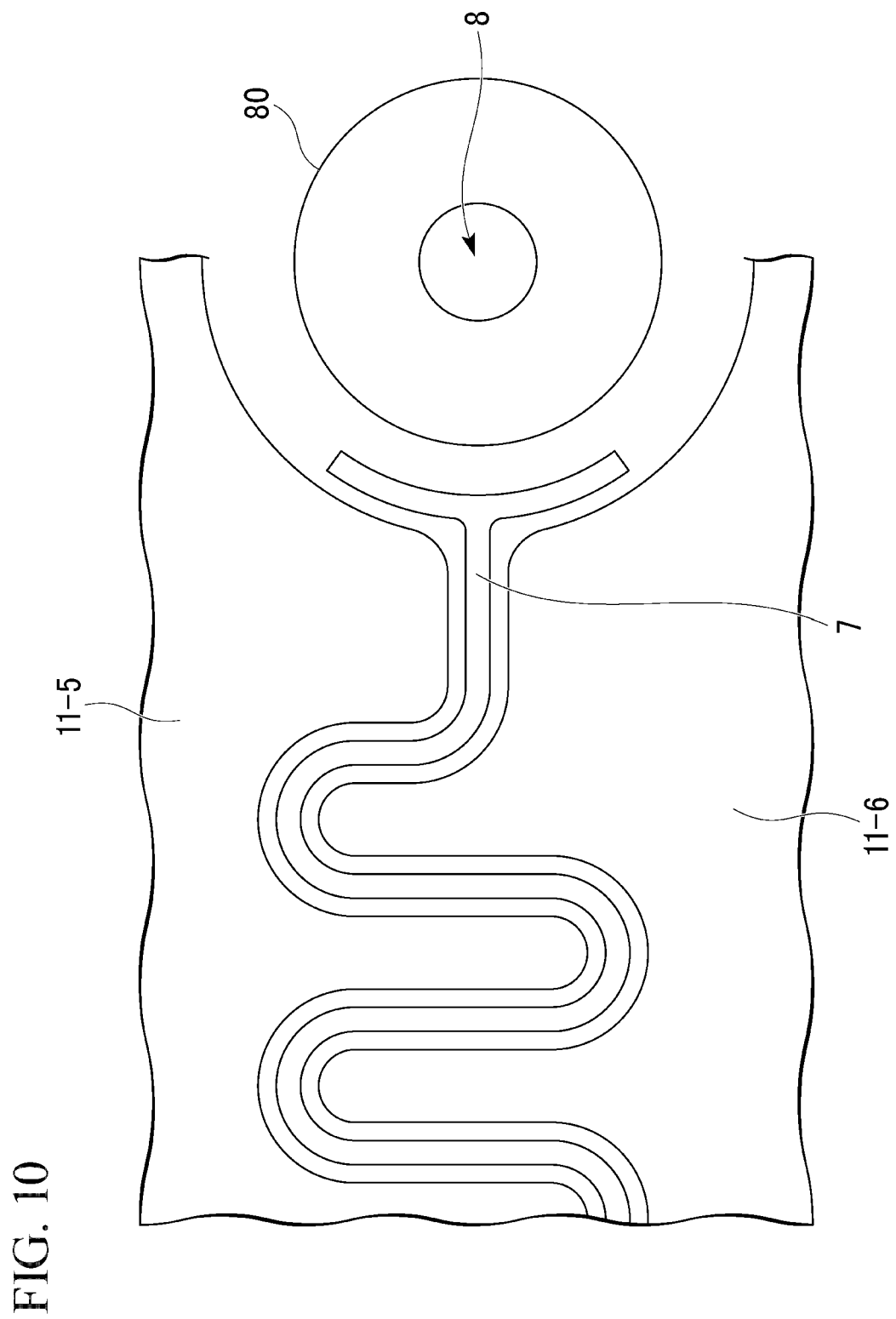
FIG. 10 is a diagram showing an example of a superconducting resonator and an observation electrode according to the embodiment of the present invention.

FIG. 10 is a diagram showing an example of the superconducting resonator 7 and the observation electrode 8 according to the present embodiment. The superconducting resonator 7 has a meandering shape on the first surface S1, as an example. The shape of the superconducting resonator 7 may be any shape as long as the superconducting resonator 7 functions as the resonator. For example, the superconducting resonator 7 may have a straight linear shape or a U-shaped curved shape instead of the meandering shape.

The observation electrode 8 includes an observation substrate through-electrode 80. The observation substrate through-electrode 80 has the same characteristics as the through-electrode 10 except that the observation substrate through-electrode 80 is provided at a different place in the circuit substrate 1.

Figure 11:
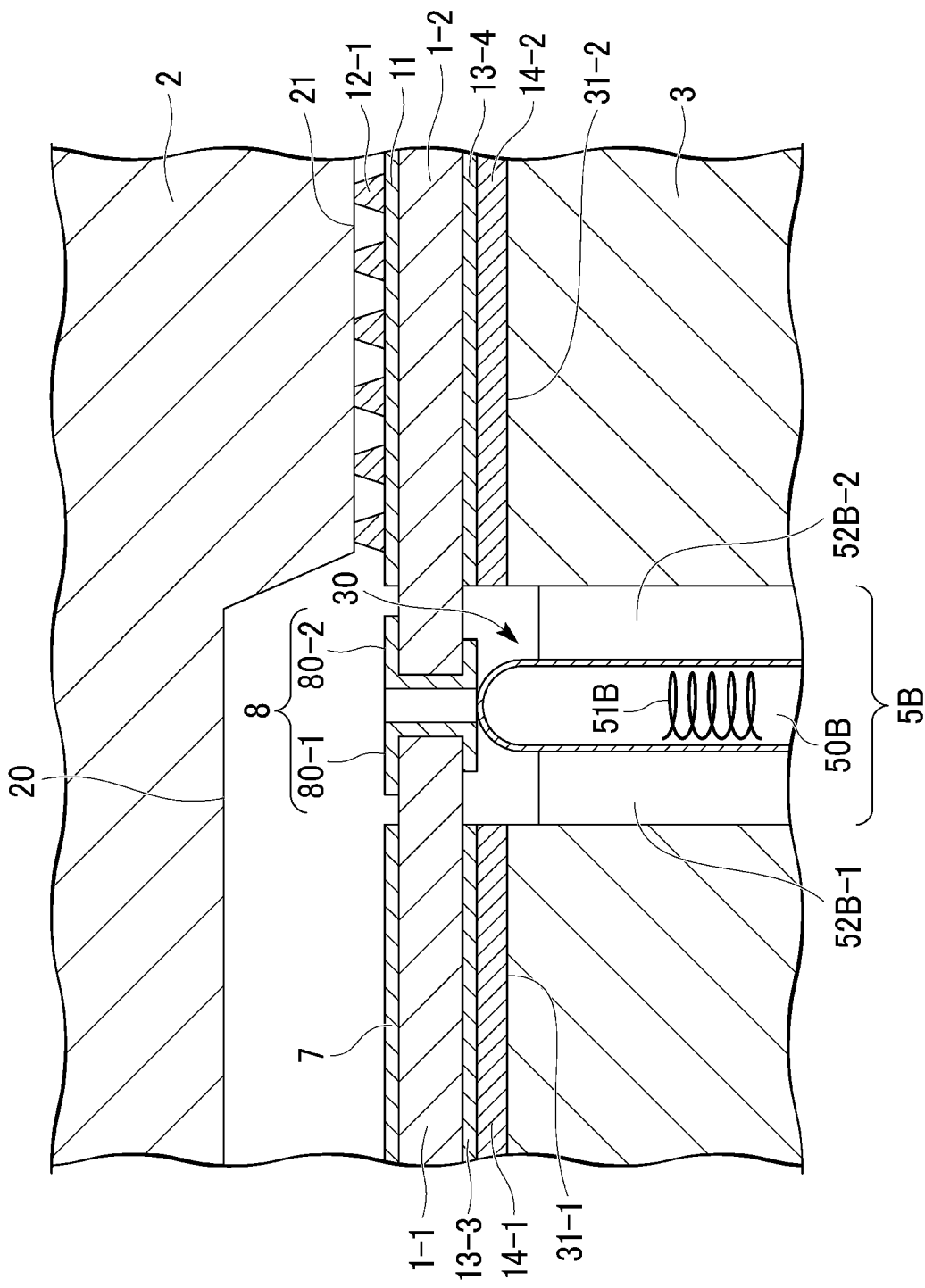
FIG. 11 is a diagram showing an example of a cross section of a part of the observation electrode of the superconducting complex quantum computing circuit according to the embodiment of the present invention.

FIG. 11 is a diagram showing an example of a cross section of a part of the observation electrode 8 of the superconducting complex quantum computing circuit QC according to the present embodiment. A shape of the observation substrate through-electrode 80 is a cylindrical shape. FIG. 11 shows, as an example of the cross section of the observation substrate through-electrode 80, an observation substrate through-electrode 80-1 and an observation substrate through-electrode 80-2.

The observation signal line 5B includes a contact spring pin 50B and a coaxial wire dielectric portion 52B. The contact spring pin 50B includes the spring 51B inside, and presses the circuit substrate 1 against the first ground electrode 2 by elastic force of the spring 51B. The coaxial wire dielectric portion 52B insulates the contact spring pin 50B from the second ground electrode 3. A shape of the coaxial wire dielectric portion 52B is a cylindrical shape. FIG. 11 shows, as an example of the cross section of the coaxial wire dielectric portion 52B, a coaxial wire dielectric portion 52B-1 and a coaxial wire dielectric portion 52B-2.

In the present embodiment, a case is described in which the control signal line 5 is arranged to extend from the inside of the second non-contact portion 30 included in the second ground electrode 3 in the direction perpendicular to the second surface S2 of the substrate surface S from the lower side. However, the present embodiment is not limited thereto. The control signal line 5 may be arranged to extend from the inside of the first non-contact portion 20 included in the first ground electrode 2 in a direction perpendicular to the first surface S1 of the substrate surface S from an upper side.

That is, the control signal line 5 may be arranged inside the first non-contact portion 20 included in the first ground electrode 2 at a position corresponding to the position of the quantum bit 4 included in the wiring pattern CP formed on the first surface S1.

In a case where the control signal line 5 is arranged to extend from the inside of the first non-contact portion 20 included in the first ground electrode 2 in the direction perpendicular to the first surface S1 of the substrate surface S from the upper side, the filter pattern 6 may not be provided in the superconducting complex quantum computing circuit QC.

Further, there may be a case where, for each quantum bit 4 and the observation electrode 8, the control signal line 5 is arranged to extend from the inside of the second non-contact portion 30 included in the second ground electrode 3 in the direction perpendicular to the second surface S2 of the substrate surface S from the lower side, and a case where the control signal line 5 is arranged to extend from the inside of the first non-contact portion 20 included in the first ground electrode 2 in the direction perpendicular to the first surface S1 of the substrate surface S from the upper side.

Note that, in the present embodiment, the case where the pressing member P presses the first ground electrode 2 against the first surface S1 of the circuit substrate 1 is described. However, the present embodiment is not limited thereto. The pressing member P may press the second ground electrode 3 against the second surface S2 of the circuit substrate 1. Further, the superconducting complex quantum computing circuit QC may include two types of pressing members, that is, a pressing member that presses the first ground electrode 2 against the first surface S1 of the circuit substrate 1, and a pressing member that presses the second ground electrode 3 against the second surface S2 of the circuit substrate 1.

As described above, the superconducting complex quantum computing circuit QC according to the present embodiment includes the circuit substrate 1, the first ground electrode 2, and the second ground electrode 3.

In the circuit substrate 1 the wiring pattern CP of the circuit element, which includes the quantum bit 4 and the observation electrode 8 for observing the state of the quantum bit 4, and the ground pattern GP which is at the ground potential are formed on the substrate surface S, and the circuit substrate 1 includes the through-electrode 10 which connects the first ground pattern GP1 formed on the first surface S1 of the substrate surface S and the second ground pattern GP2 formed on the second surface S2, which is the surface opposite the first surface S1, inside the substrate.

The first ground electrode 2 includes the first contact portion 21 which is in contact with the first ground pattern GP1 formed on the first surface S1 of the circuit substrate 1, and the first non-contact portion 20 which has a shape corresponding to the shape of the wiring pattern CP formed on the first surface S1.

The second ground electrode 3 includes the second contact portion 31 which is in contact with the second ground pattern GP2 formed on the second surface S2 of the circuit substrate 1.

With this configuration, in the superconducting complex quantum computing circuit QC according to the present embodiment, it is possible to suppress the generation and extension of the unnecessary electromagnetic mode (a resonance phenomenon of electromagnetic waves) in a space on an upper side of the quantum bit 4 or in the circuit substrate 1, and thus interaction or crosstalk between the quantum bits can be suppressed.

In the superconducting complex quantum computing circuit QC, the first ground electrode 2 causes the space on the upper side of the quantum bit 4 to be small, compared to a case where the first ground electrode 2 is not provided. The unnecessary electromagnetic mode may occur in the space on the upper side of the quantum bit 4. In the superconducting complex quantum computing circuit QC, a mode frequency of the unnecessary electromagnetic mode can be detuned from the frequency of the quantum bit 4. Further, in the superconducting complex quantum computing circuit QC, the extension of the unnecessary electromagnetic mode in the space on the upper side of the quantum bit 4 is localized, and thus it is possible to suppress crosstalk of the control signal of the quantum bit 4 over a wide range.

The through-electrode 10 can suppress the generation of the unnecessary electromagnetic mode in the circuit substrate 1 and can suppress the crosstalk of the control signal between the quantum bits 4 over the wide range.

Further, the superconducting complex quantum computing circuit QC according to the present embodiment further includes the pressing member P that presses the first ground electrode 2 against the first surface S1 of the circuit substrate 1, or presses the second ground electrode 3 against the second surface S2 of the circuit substrate 1.

Here, the first ground electrode 2 is in contact with the ground pattern GP via the first extension portion 12 formed by the superconductor having the extensibility higher than the extensibility of the ground pattern GP.

The second ground electrode 3 is in contact with the ground pattern GP via the second extension portion 14 formed by the superconducting bodies having the extensibility higher than the extensibility of the ground pattern GP.

With this configuration, in the superconducting complex quantum computing circuit QC according to the present embodiment, it is possible to remove a gap between the first ground electrode 2 and the ground pattern GP on the first surface S1 of the circuit substrate 1 or a gap between the second ground electrode 3 and the ground pattern GP on the second surface S2 of the circuit substrate 1, and thus it is possible to suppress crosstalk with both the control signal and the observation signal which are propagated to the adjacent control signal line 5.

Further, in the superconducting complex quantum computing circuit QC according to the present embodiment, the quantum bit 4 includes a first electrode (in the example, the inner disk 40) which has a first coupling capacitance (in the example, the first capacitance C1) with the ground portion GE, and a second electrode (in the example, the outer ring 41) which has a second coupling capacitance (in the example, the second capacitance C2) with the ground portion GE larger than the first coupling capacitance (in the example, first capacitance C1) and which is connected to the first electrode (in the example, the inner disk 40) by the Josephson junction 42.

With this configuration, in the superconducting complex quantum computing circuit QC according to the present embodiment, shielding from the unnecessary electromagnetic mode, which propagates through the metal electrode (in the example, the inner disk 40 and the outer ring 41) constituting the quantum bit 4, is possible with the outer ring 41, and thus it is possible to suppress an error rate of the quantum bit 4. Here, the unnecessary electromagnetic mode, which propagates through the metal electrode (in the example, the inner disk 40 and the outer ring 41) constituting the quantum bit 4, is, for example, an unnecessary electromagnetic mode that remains even though the first ground electrode 2, the through-electrode 10, and the like are included.

In the related art, two metal electrodes forming the quantum bit are symmetrical with respect to the ground electrode, or the metal electrode on one side is grounded. A case where the two metal electrodes are symmetrical with respect to the ground electrode is a case where a coupling capacitance between one metal electrode of the two metal electrodes and the ground electrode is equal to a coupling capacitance between the other metal electrode of the two metal electrodes and the ground electrode. Further, in a case where the metal electrode on one side of the two metal electrodes forming the quantum bit is grounded is a case where the metal electrode on one side has an equivalent function as the ground electrode.

In the superconducting complex quantum computing circuit QC according to the present embodiment, it is possible to eliminate an influence of potential fluctuation of a ground electrode surface by not short-circuiting the metal electrode on one side of the two metal electrodes forming the quantum bit to the ground electrode.

Further, in the superconducting complex quantum computing circuit QC according to the present embodiment, the circuit substrate 1 includes, at the quantum bit correspondence position, which is the position of the second surface S2 corresponding to the position of the quantum bit 4 included in the first ground pattern GP1 formed on the first surface S1, the central electrode 60, a surrounding electrode that surrounds the surroundings of central electrode 60 (in the example, the substrate bottom surface ground electrode 13), and the connection electrode 62 which connects the central electrode 60 and the surrounding electrode (in the example, the substrate bottom surface ground electrode 13).

With this configuration, in the superconducting complex quantum computing circuit QC according to the present embodiment, in a case where the control of the quantum bit 4 is off, it is possible to suppress leakage of the energy of the quantum bit 4 to the outside due to the interaction between the quantum bit 4 and the control signal line 5. Therefore, it is possible to suppress an error rate of calculation of the quantum bit 4.

Further, the superconducting complex quantum computing circuit QC according to the present embodiment further includes the control signal line 5. The control signal line 5 is arranged inside the first non-contact portion 20 included in the first ground electrode 2 in the position corresponding to the position of the quantum bit 4 included in the wiring pattern CP formed on the first surface S1, or inside of the second non-contact portion included in the second ground electrode 3 at the position corresponding to the quantum bit correspondence position, which is the position of the second surface S2 corresponding to the position of the quantum bit 4 included in the wiring pattern CP formed on the first surface S1, and supplies the control signal to the quantum bit 4.

With this configuration, in the superconducting complex quantum computing circuit QC according to the present embodiment, it is possible to secure a constant density of the wiring pattern CP regardless of the number of quantum bits 4 on the substrate surface S of the circuit substrate 1. Therefore, it is possible to suppress an increase in the density of the wiring pattern CP on the substrate surface S of the circuit substrate 1.

Conventionally, the control signal line is introduced from the side surface of the substrate and controls the quantum bits arranged on the two-dimensional plane of the surface of the substrate from the periphery of the substrate. In a conventional circuit, as the number of quantum bits increases, the wiring density of the circuit increases, which eventually reaches its limit.

On the other hand, in the superconducting complex quantum computing circuit QC according to the present embodiment, a three-dimensional structure is made in which the control signal line 5 is arranged on the second surface S2 on the lower side of the circuit substrate 1 or the first surface S1 on the upper side. Therefore, it is possible to secure the constant density of the wiring pattern CP regardless of the number of quantum bits 4. In the superconducting complex quantum computing circuit QC according to the present embodiment, it is possible to secure the constant density of the wiring pattern CP regardless of the number of quantum bits 4. Therefore, it is possible to ensure expandability toward a large-scale circuit.

Further, in the superconducting complex quantum computing circuit QC according to the present embodiment, the frequency band of the control signal supplied to the quantum bit 4 through the control signal line 5 is the microwave band.

In the superconducting complex quantum computing circuit QC according to the present embodiment, it is possible to use a microwave signal for the control and the observation.

Therefore, as compared to the control by radio frequency (RF) according to the related art, it is possible to minimize a surface current area through which the ground electrode flows, and it is possible to suppress fluctuation of an electrode potential.

Modified Example of Metal Electrode Constituting Quantum Bit

In the above-described embodiment, the case where the inner disk 40, which is the metal electrode constituting the quantum bit 4, and the outer ring 41 form the concentric metal electrodes is described. However, a shape of the metal electrode constituting the quantum bit 4 is not limited to the concentric circle.

Here, a modified example of the shape of the metal electrode constituting the quantum bit 4 will be described with reference to FIGS. 12 to 18. In the modified example, parts different from the metal electrode (FIG. 4) constituting the quantum bit 4 of the above-described embodiment will be mainly described.

Figure 12:
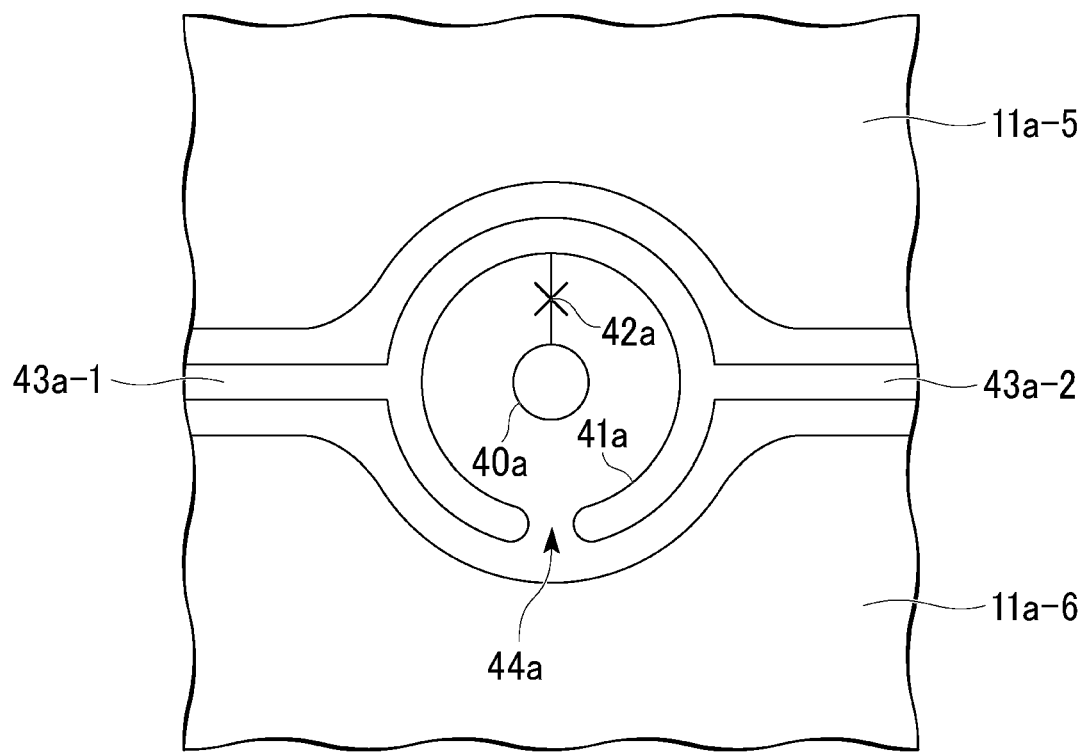
FIG. 12 is a diagram showing an example of a quantum bit according to a modified example of the present invention.

FIG. 12 is a diagram showing an example of a quantum bit 4a according to the modified example of the present embodiment. The quantum bit 4a includes an inner disk 40a, an outer ring 41a, a Josephson junction 42a, a quantum bit hand portion 43a-1, and a quantum bit hand portion 43a-2.

Figure 13:
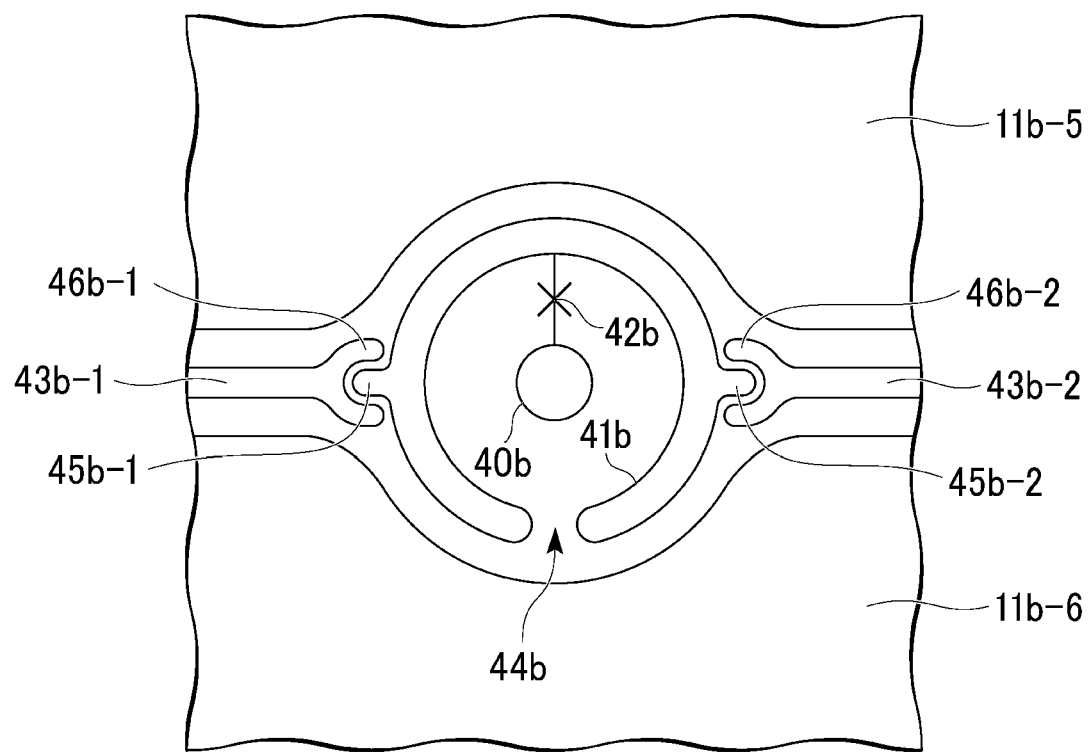
FIG. 13 is a diagram showing an example of the quantum bit according to the modified example of the present invention.

Unlike the outer ring 41 (FIG. 4), the outer ring 41a is not closed and has a gap 44a. FIG. 13 is a diagram showing an example of a quantum bit 4b according to the modified example of the present embodiment. The quantum bit 4b includes an inner disk 40b, an outer ring 41b, a Josephson junction 42b, a quantum bit hand portion 43b-1, and a quantum bit hand portion 43b-2.

Unlike the outer ring 41 (FIG. 4), the outer ring 41b is not closed and has a gap 44b. Unlike the outer ring 41a (FIG. 12), the outer ring 41b is not directly connected to the quantum bit hand portion 43b.

The outer ring 41b has a convex portion 45b-1 and a convex portion 45b-2. The quantum bit hand portion 43b-1 has a tip portion 46b-1, and the quantum bit hand portion 43b-2 has a tip portion 46b-2. The convex portion 45b-1 and the convex portion 45b-2 form concave portions according to shapes of the tip portion 46b-1 and a tip portion 46b-2.

Figure 14:
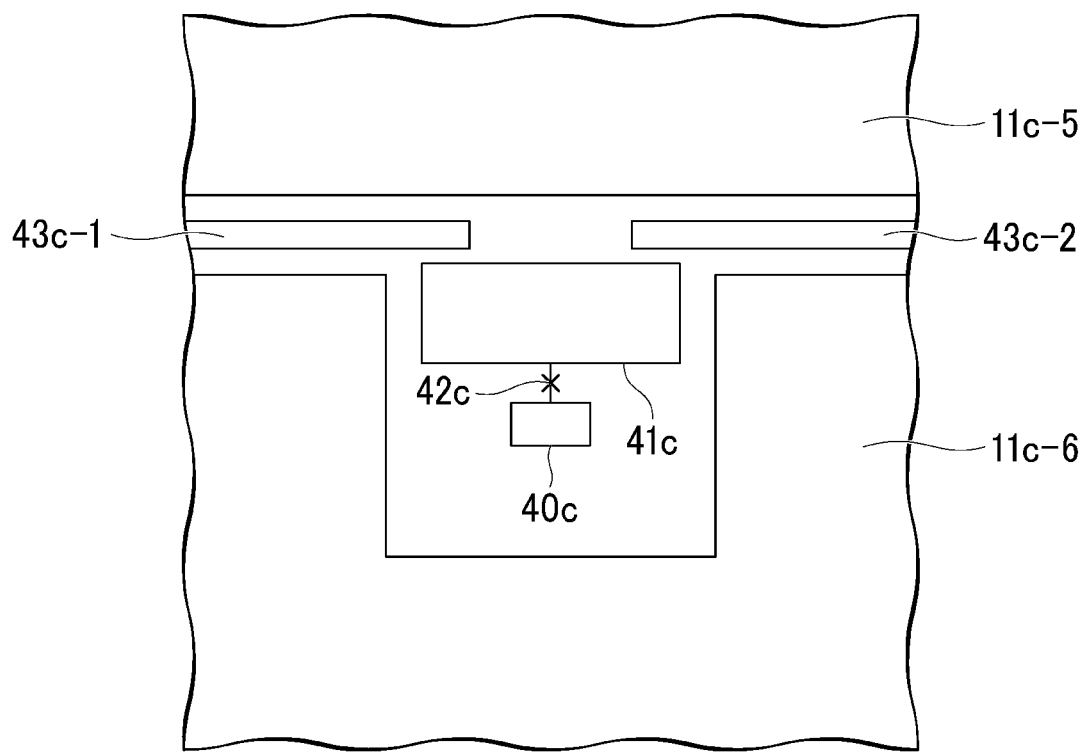
FIG. 14 is a diagram showing an example of the quantum bit according to the modified example of the present invention.

FIG. 14 is a diagram showing an example of a quantum bit 4c according to the modified example of the present embodiment. The quantum bit 4c includes a first rectangle 40c, a second rectangle 41c, a Josephson junction 42c, a quantum bit hand portion 43c-1, and a quantum bit hand portion 43c-2

The first rectangle 40c and the second rectangle 41c are connected by the Josephson junction 42c. A distance between the first rectangle 40c and a substrate top surface ground electrode 11c-6 is large enough to make the value of the first capacitance C1 sufficiently smaller than the value of the second capacitance C2. In FIG. 14, as an example, an area of the first rectangle 40c is reduced and the distance between the first rectangle 40c and the substrate top surface ground electrode 11c-6 is increased. A length of a side of the second rectangle 41c facing the first rectangle 40c is longer than a length of a side of the first rectangle 40c facing the second rectangle 41c.

The quantum bit hand portion 43c-1 and the quantum bit hand portion 43c-2 are not directly connected to the second rectangle 41c.

Shapes of a substrate top surface ground electrode 11c-5 and a substrate top surface ground electrode 11c-6 are different from those of the substrate top surface ground electrode 11-5 (FIG. 4) and the substrate top surface ground electrode 11-6 (FIG. 4) according to a shape of the first rectangle 40c and a shape of the second rectangle 41c.

Figure 15:
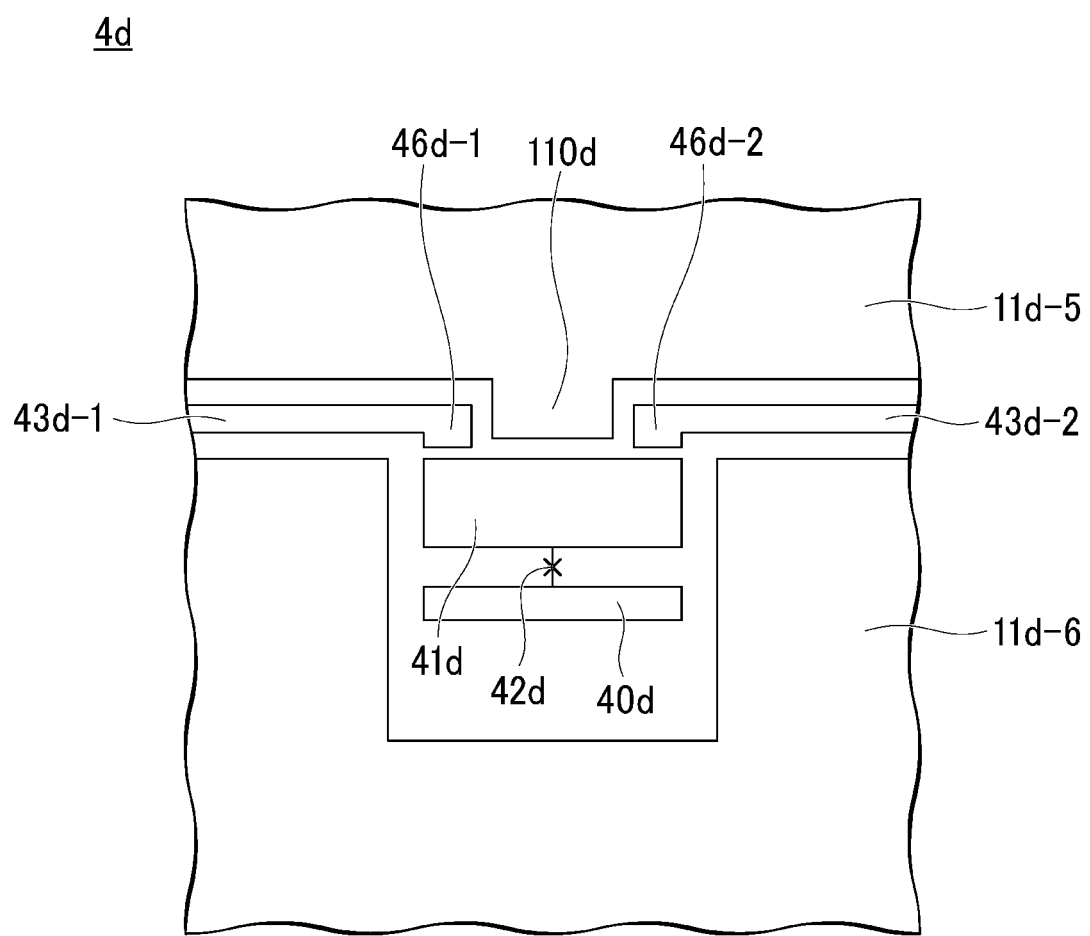
FIG. 15 is a diagram showing an example of the quantum bit according to the modified example of the present invention.

FIG. 15 is a diagram showing an example of a quantum bit 4d according to the modified example of the present embodiment. The quantum bit 4d includes a first rectangle 40d, a second rectangle 41d, a Josephson junction 42d, a quantum bit hand portion 43d-1, and a quantum bit hand portion 43d-2

A distance between the first rectangle 40d and the substrate top surface ground electrode 11d-6 is large enough to make the value of the first capacitance C1 sufficiently smaller than the value of the second capacitance C2. In FIG. 15, as an example, an area of the first rectangle 40d is reduced and the distance between the first rectangle 40d and the substrate top surface ground electrode 11d-6 is increased. In the example shown in FIG. 15, a length of a side of the second rectangle 41d facing the first rectangle 40d is equal to a length of a side of the first rectangle 40d facing the second rectangle 41d. The length of the side of the second rectangle 41d facing the first rectangle 40d and the length of the side of the first rectangle 40d facing the second rectangle 41d may not be equal as in the first rectangle 40c and the second rectangle 41c in FIG. 14.

The quantum bit hand portion 43d-1 has a bent tip portion 46d-1, and the quantum bit hand portion 43d-2 has a bent tip portion 46d-2. A substrate top surface ground electrode 11d-5 has a convex portion 110d. The tip portion 46d-1, the tip portion 46d-2, and the convex portion 110d face the second rectangle 41d. In the quantum bit 4d of FIG. 15, due to the tip portion 46d-1, the tip portion 46d-2, and the convex portion 110d, the second capacitance C2 becomes large, compared to the case where the tip portion 46d-1, the tip portion 46d-2, and the convex portion 110d are not provided.

Figure 16:
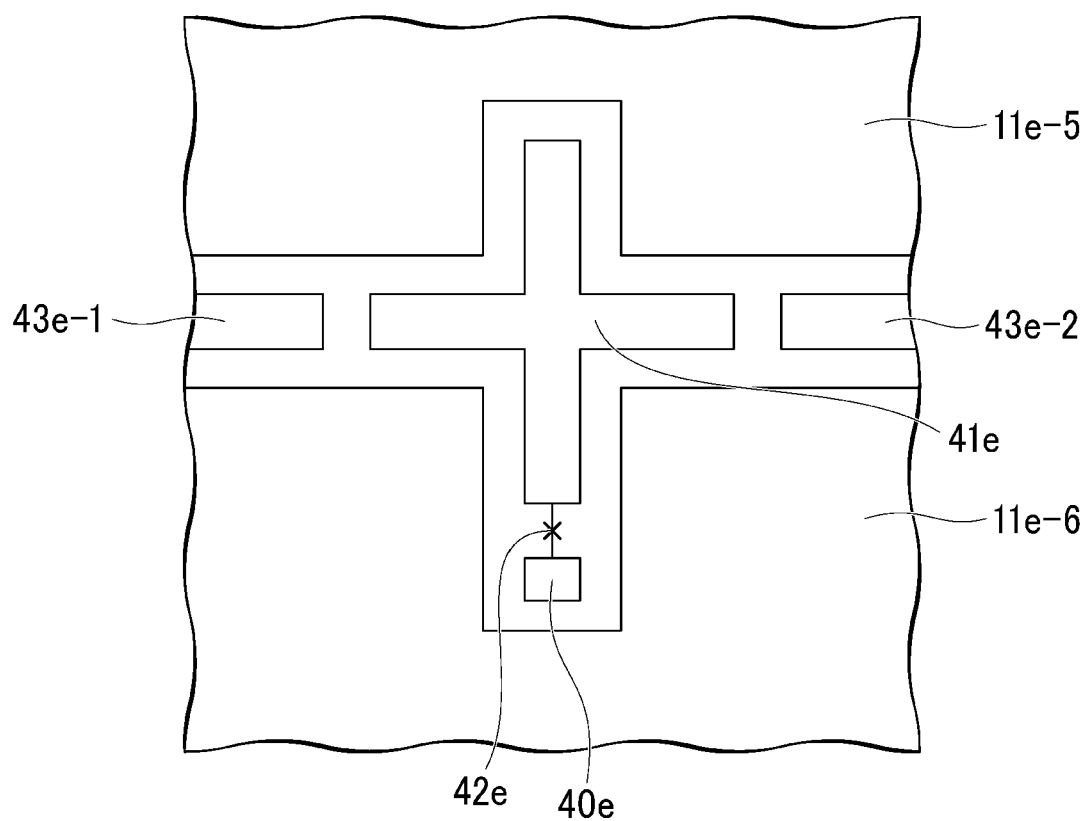
FIG. 16 is a diagram showing an example of the quantum bit according to the modified example of the present invention.

FIG. 16 is a diagram showing an example of a quantum bit 4e according to the modified example of the present embodiment. The quantum bit 4e includes a first rectangle 40e, a cross 41e, and a Josephson junction 42e. Each of a cross part 43e-1 and a cross part 43e-2 is shown as a part of a cross of a quantum bit adjacent to the quantum bit 4e.

The first rectangle 40e and the cross 41e are connected by the Josephson junction 42e.

Shapes of a substrate top surface ground electrode 11e-5 and a substrate top surface ground electrode 11e-6 are different from those of the substrate top surface ground electrode 11-5 (FIG. 4) and the substrate top surface ground electrode 11-6 (FIG. 4) according to a shape of the first rectangle 40e and a shape of the cross 41e.

Figure 17:
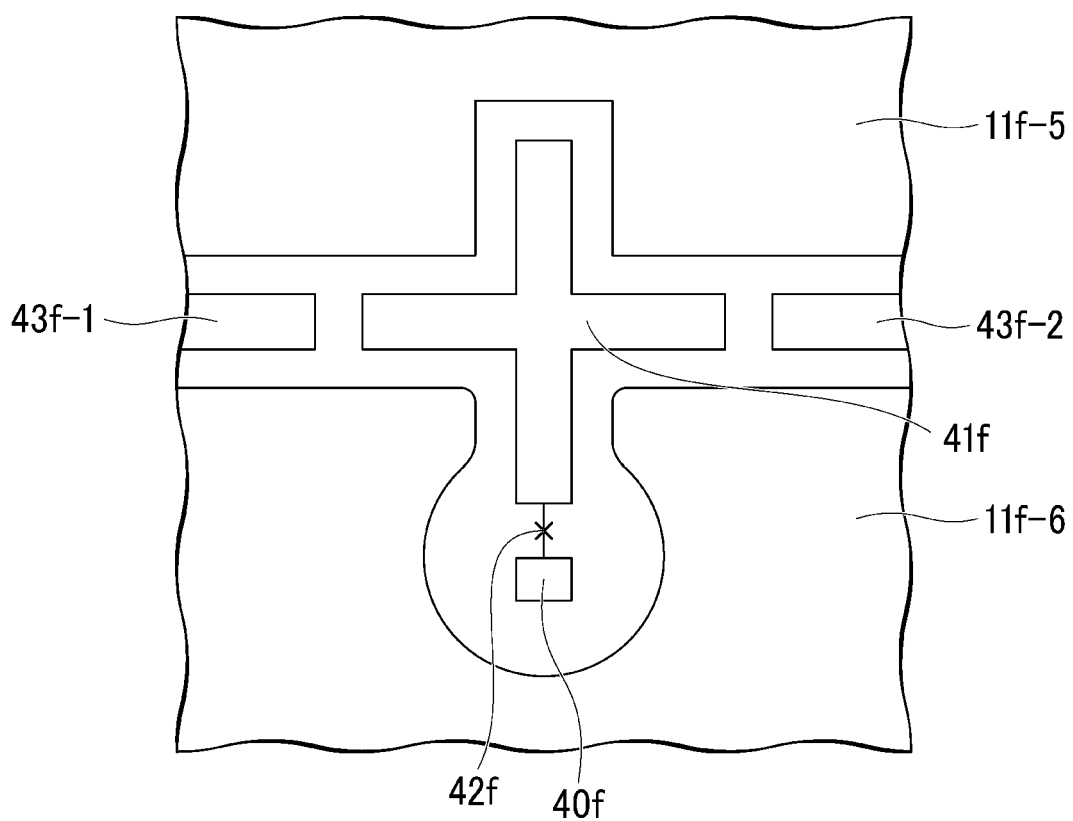
FIG. 17 is a diagram showing an example of the quantum bit according to the modified example of the present invention.

FIG. 17 is a diagram showing an example of a quantum bit 4f according to the modified example of the present embodiment. The quantum bit 4f includes a first rectangle 40f, a cross 41f, and a Josephson junction 42f Each of a cross part 43f-1 and a cross part 43f-2 is shown as a part of a cross of a quantum bit adjacent to the quantum bit 4f.

The quantum bit 4f (FIG. 17) is different from the quantum bit 4e (FIG. 16) in that a distance between the first rectangle 40f (FIG. 17) and a substrate top surface ground electrode 11f-2 (FIG. 17) is larger than a distance between the first rectangle 40e (FIG. 16) and a substrate top surface ground electrode 11e-2 (FIG. 16). In the example, the shape of the part of the substrate top surface ground electrode 11e-2 (FIG. 16) facing the cross 41e (FIG. 16) and the first rectangle 40e (FIG. 16) is a straight line. In contrast, the shape of the part of the substrate top surface ground electrode 11f-2 (FIG. 17) facing the cross 41f (FIG. 17) and the first rectangle 40f (FIG. 17) is a curved line. Therefore, a distance between the first rectangle 40f (FIG. 17) and the substrate top surface ground electrode 11f-2 (FIG. 17) is large.

In the quantum bit 4f (FIG. 17), the distance between the first rectangle 40f (FIG. 17) and the substrate top surface ground electrode 11f-2 (FIG. 17) is large, so that the first capacitance C1 is smaller than that of the quantum bit 4e (FIG. 16).

Figure 18:
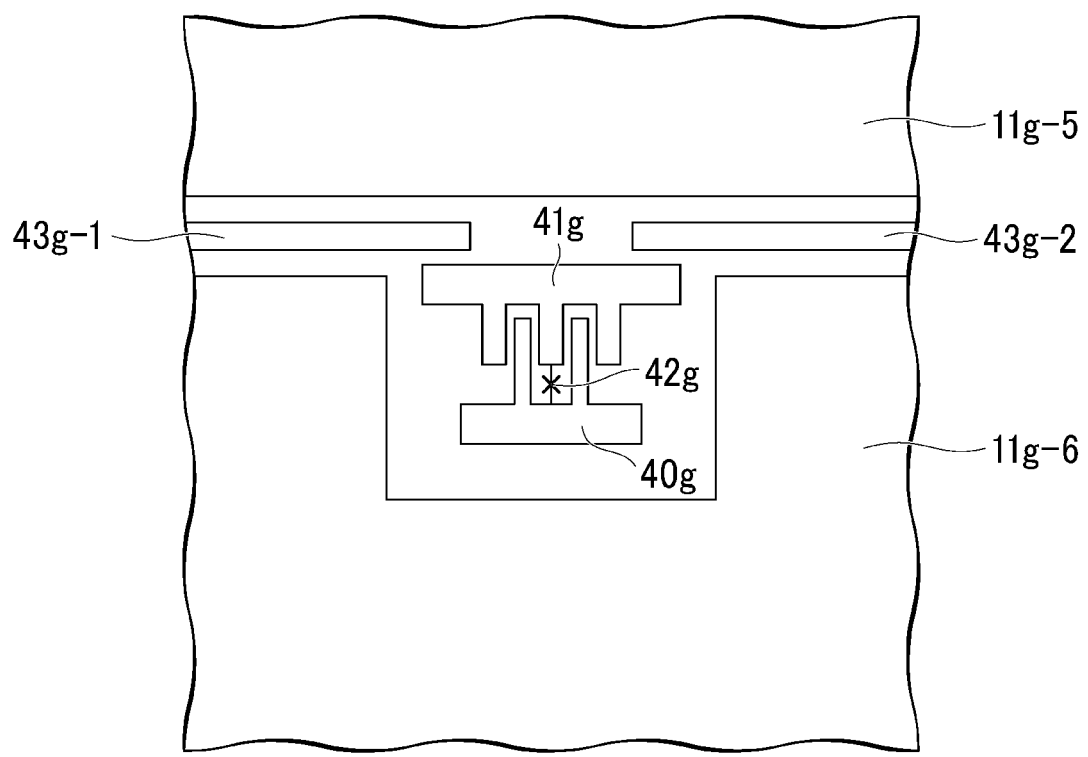
FIG. 18 is a diagram showing an example of the quantum bit according to the modified example of the present invention.

FIG. 18 is a diagram showing an example of a quantum bit 4g according to the modified example of the present embodiment. The quantum bit 4g includes a first electrode 40g, a second electrode 41g, a Josephson junction 42g, a quantum bit hand portion 43g-1, and a quantum bit hand portion 43g-2.

The first electrode 40g and the second electrode 41g are connected by the Josephson junction 42g. The first electrode 40g and the second electrode 41g each have a comb-shaped shape, and form a comb-shaped electrode by facing each other. In the example shown in FIG. 18, the first electrode 40g has two teeth and the second electrode 41g has three teeth.

A distance between the first electrode 40g and the substrate top surface ground electrode 11g-6 is large enough to make the value of the first capacitance C1 sufficiently smaller than the value of the second capacitance C2. In FIG. 18, as an example, an area of the first electrode 40g is reduced and the distance between the first electrode 40g and the substrate top surface ground electrode 11g-6 is increased.

In the above-described modified examples, the inner disk 40a, the inner disk 40b, the first rectangle 40c, the first rectangle 40d, the first rectangle 40e, the first rectangle 40f, and the first electrode 40g are examples of the first electrode. The outer ring 41a, the outer ring 41b, the second rectangle 41c, the second rectangle 41d, the cross 41e, the cross 41f, and the second electrode 41g are examples of the second electrode.

A coupling capacitance between the second electrode and the ground portion GE is larger than a coupling capacitance between the first electrode and the ground portion GE. A potential difference between the first electrode and the second electrode is hardly affected by fluctuation of the potential due to the unnecessary radiation electric field E, compared to a case where the coupling capacitance between the second electrode and the ground portion GE is not larger than the coupling capacitance between the first electrode and the ground portion GE.

Modified Example of Filter Pattern

In the above-described embodiment, the case where, in the filter pattern 6, the central electrode 60 and the substrate bottom surface ground electrode 13 are connected by the four connection electrodes 62 has been described. However, the present invention is not limited thereto.

Here, modified examples of the filter pattern 6 will be described with reference to FIGS. 19 to 21. In the modified examples, parts different from the filter pattern 6 (FIG. 6) of the above-described embodiment will be mainly described.

Figure 19:
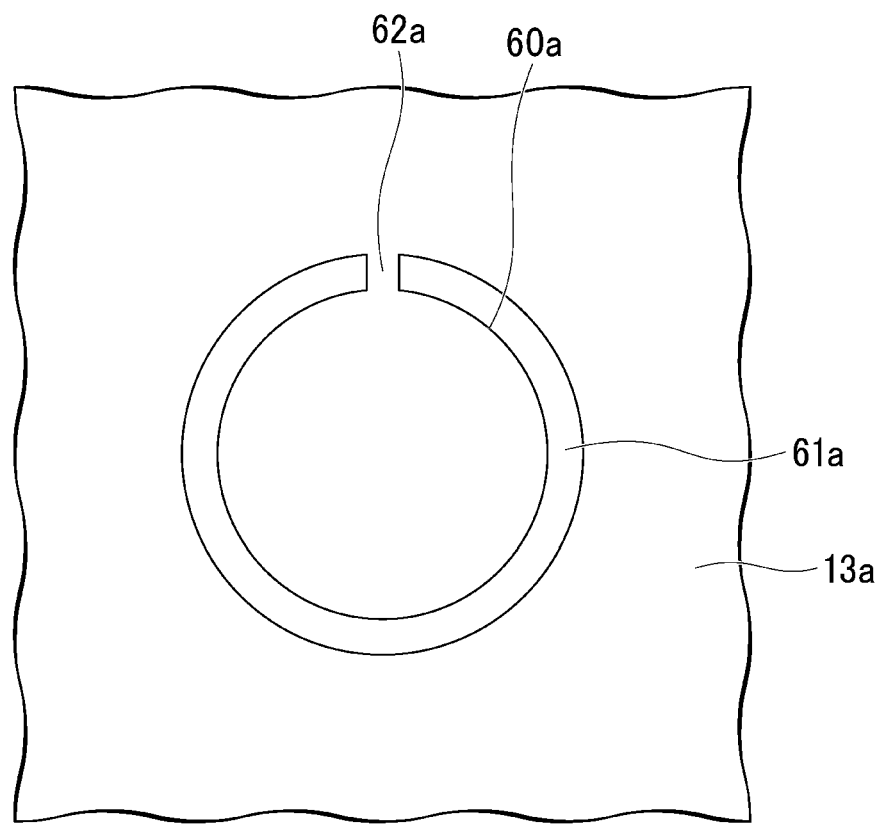
FIG. 19 is a diagram showing an example of a filter pattern according to the modified example of the present invention.

FIG. 19 is a diagram showing an example of a filter pattern 6a according to the present embodiment. The filter pattern 6a includes a central electrode 60a and a connection electrode 62a. The central electrode 60a is surrounded by a substrate bottom surface ground electrode 13a via a gap portion 61a. The central electrode 60a and the substrate bottom surface ground electrode 13a are connected by one connection electrode 62a.

The number of connection electrodes 62 is not limited to the case of four described in FIG. 6 or the case of one described in FIG. 19, and the number of connection electrodes 62 may be two, three, five or more.

Figure 20:
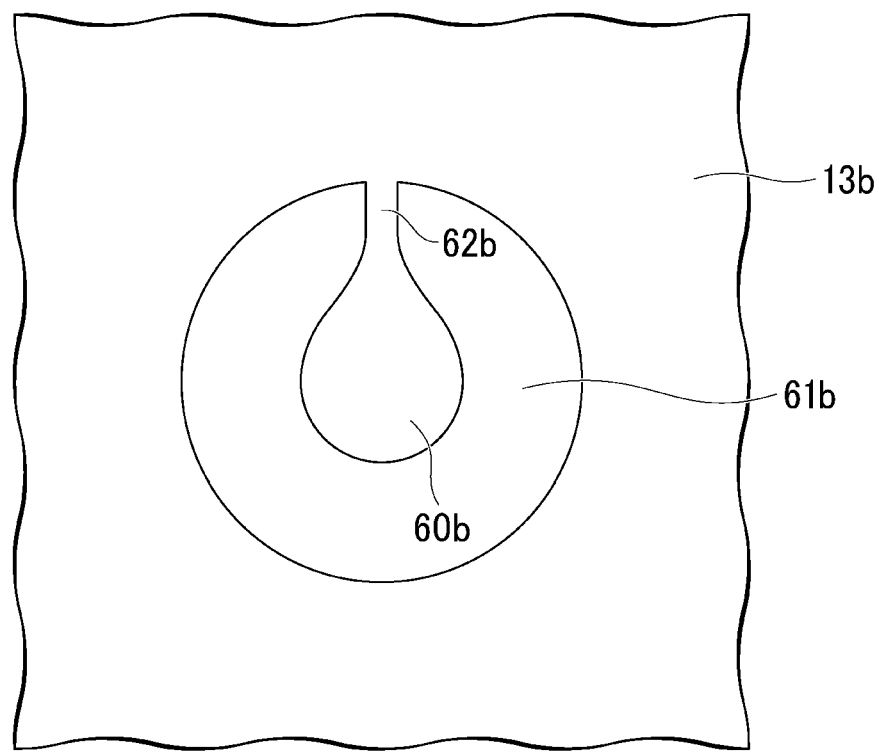
FIG. 20 is a diagram showing an example of the filter pattern according to the modified example of the present invention.

FIG. 20 is a diagram showing an example of a filter pattern 6b according to the present embodiment. The filter pattern 6b includes a central electrode 60b and a connection electrode 62b. The central electrode 60b is surrounded by a substrate bottom surface ground electrode 13b via a gap portion 61b. The central electrode 60b and the substrate bottom surface ground electrode 13b are connected via the connection electrode 62b.

In the filter pattern 6b, the central electrode 60b and the connection electrode 62b are integrally provided. The central electrode 60b and the connection electrode 62b form a curved contour, as an example. A width of the connection electrode 62b (FIG. 20) becomes narrow in a direction from the central electrode 60b toward the substrate bottom surface ground electrode 13b.

The number of connection electrodes 62b is not limited to the case of one described in FIG. 20, and may be two or more.

Figure 21:
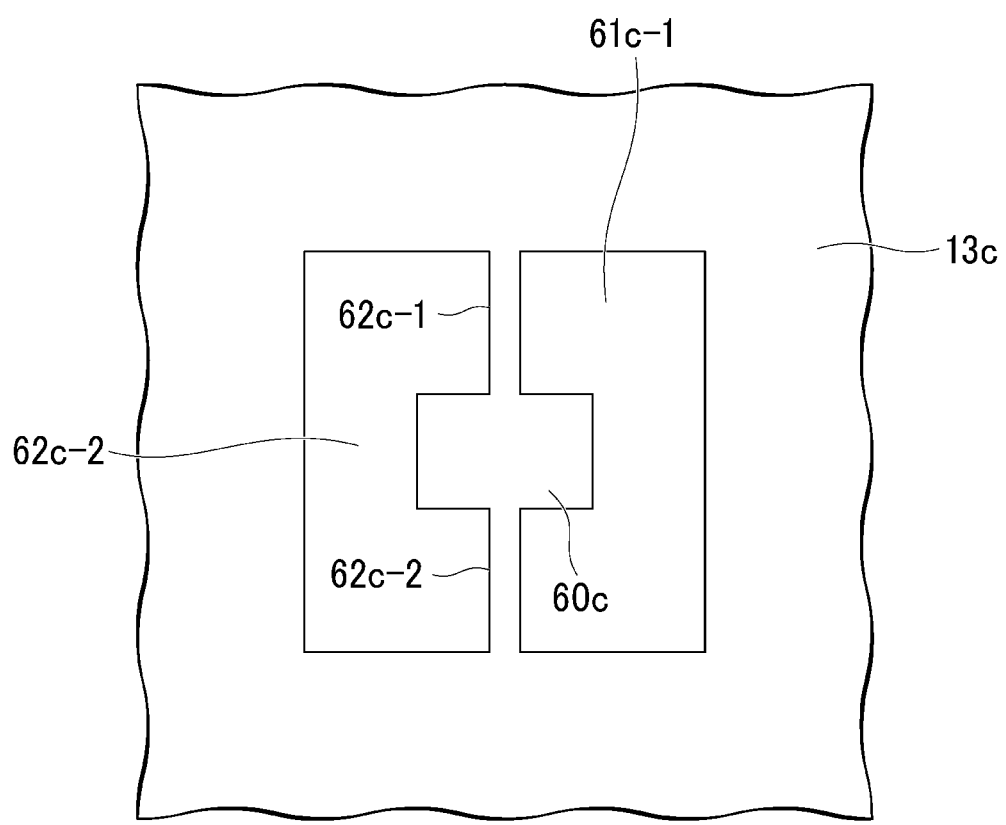
FIG. 21 is a diagram showing an example of the filter pattern according to the modified example of the present invention.

FIG. 21 is a diagram showing an example of a filter pattern 6c according to the present embodiment. The filter pattern 6c includes a central electrode 60c, a connection electrode 62c-1, and a connection electrode 62c-2. The central electrode 60c is surrounded by a substrate bottom surface ground electrode 13c via a gap portion 61b-1 and a gap portion 61b-2. The central electrode 60c and the substrate bottom surface ground electrode 13c are connected via the connection electrode 62c-1 and the connection electrode 62c-2.

A shape of the central electrode 60c is a rectangle.

The number of connection electrodes 62c-1 and the number of connection electrodes 62c-2 is not limited to the case of two described in FIG. 21, and may be one or three or more.

Although some embodiments are described in detail with reference to the drawings, a specific configuration is not limited to the above description, and various design changes and the like are possible in a scope not departing from the gist of the invention.

REFERENCE NUMERALS LIST

QC: Superconducting complex quantum computing circuit
1: Circuit substrate
S: Substrate surface
S1: First surface
S2: Second surface
2: First ground electrode
3: Second ground electrode
4: Quantum bit
5: Control signal line
6: Filter pattern
7: Superconducting resonator
8: Observation electrode
9: Capacitor
10: Through-electrode
10, 11: Substrate top surface ground electrode
12: First extension portion
13: Substrate bottom surface ground electrode
14: Second extension portion
20: First non-contact portion
21: First contact portion
30: Second non-contact portion
31: Second contact portion
40: Inner disk
41: Outer ring
42: Josephson junction
43: Quantum bit hand portion
45: Substrate bottom surface ground electrode
46: tip portion
50: Contact pin
60: Central electrode
61: Gap portion
61, 62: Connection electrode
80: Observation substrate through-electrode P: Pressing member
CP: Wiring pattern
GP: Ground pattern

What is claimed is:

1. A superconducting quantum computing circuit, comprising:
a circuit substrate having a first surface, a second surface which is an opposite surface of the first surface, and a plurality of through-substrate electrodes;
a wiring pattern of a circuit element, and a first ground pattern formed on the first surface, wherein the circuit element includes a plurality of superconducting qubits and measurement electrodes for observing the state of the plurality of superconducting qubits;
a second ground pattern formed on the second surface of the circuit substrate;
a control signal line for providing a control signal, wherein the control signal line is in contact with the circuit substrate from a directoin perpendicular to the circuit substrate, corresponding to the position of the superconducting qubit;
a first ground electrode facing the first surface of the circuit substrate and having a first contact portion which is in contact with the first ground pattern formed on the first surface of the circuit substrate;
a first non-contact portion, facing the first surface of the circuit substrate, which is not contact with the first surface of the circuit substrate,
wherein the control signal line is arranged in the first non-contact portion; and
wherein the plurality of through-substrate electrodes connect the first ground pattern and the second ground pattern.

2. The superconducting complex quantum computing circuit according to claim 1,
wherein the control signal line that is provided with a contact spring pin, the contact spring pin being in contact with a position corresponding to the quantum bit to press the first surface of the circuit substrate against a first ground electrode by pressing the second surface of the circuit substrate or to press the second surface of the circuit substrate against a second ground electrode by pressing the first surface of the circuit substrate.

3. The superconducting complex quantum computing circuit according to claim 2,
wherein the control signal line that is provided with a coaxial wire dielectric portion which insulates the contact spring pin from the second ground electrode.

4. The superconducting complex quantum computing circuit according to claim 1,
wherein the superconducting quantum bit includes a first electrode comprising an inner disk and a second electrode comprising an outer ring that are connected by a single Josephson junction or by a plurality of Josephson junctions and
wherein a coupling capacitance between the second electrode and the first ground pattern, is larger than a coupling capacitance between the first electrode and the first ground pattern.

5. The superconducting quantum computing circuit according to claim 1,
wherein the control signal line that is provided with a contact pin at the circuit substrate, the contact pin that is provided the control signal being in contact with a position surrounding the superconducting quantum bit to press the first surface of the circuit substrate or to press the second surface of the circuit substrate.

* * * * *